(12) United States Patent
Yu et al.

(10) Patent No.: US 11,444,020 B2
(45) Date of Patent: Sep. 13, 2022

(54) VIA FOR SEMICONDUCTOR DEVICE CONNECTION AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); An-Jhih Su, Taoyuan (TW); Chi-Hsi Wu, Hsinchu (TW); Wen-Chih Chiou, Zhunan Township (TW); Tsang-Jiuh Wu, Hsinchu (TW); Der-Chyang Yeh, Hsinchu (TW); Ming Shih Yeh, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 13 days.

(21) Appl. No.: 16/846,750

(22) Filed: Apr. 13, 2020

(65) Prior Publication Data
US 2020/0243442 A1 Jul. 30, 2020

Related U.S. Application Data

(62) Division of application No. 16/121,360, filed on Sep. 4, 2018, now Pat. No. 10,622,302.
(Continued)

(51) Int. Cl.
*H01L 23/522* (2006.01)
*H01L 21/768* (2006.01)
(Continued)

(52) U.S. Cl.
CPC ...... *H01L 23/5226* (2013.01); *H01L 21/0228* (2013.01); *H01L 21/02271* (2013.01);
(Continued)

(58) Field of Classification Search
None
See application file for complete search history.

(56) References Cited

U.S. PATENT DOCUMENTS 4,738,937 A 4/1988 Parsons
6,184,066 B1 2/2001 Chino et al.
(Continued)

FOREIGN PATENT DOCUMENTS

CN 1971877 A 5/2007
CN 104054171 A 9/2014
(Continued)

*Primary Examiner* — Long Pham
(74) *Attorney, Agent, or Firm* — Slater Matsil, LLP

(57) ABSTRACT

A method for forming a via in a semiconductor device and a semiconductor device including the via are disclosed. In an embodiment, the method may include bonding a first terminal and a second terminal of a first substrate to a third terminal and a fourth terminal of a second substrate; separating the first substrate to form a first component device and a second component device; forming a gap fill material over the first component device, the second component device, and the second substrate; forming a conductive via extending from a top surface of the gap fill material to a fifth terminal of the second substrate; and forming a top terminal over a top surface of the first component device, the top terminal connecting the first component device to the fifth terminal of the second substrate through the conductive via.

20 Claims, 13 Drawing Sheets

US 11,444,020 B2
Page 2

Related U.S. Application Data

(60) Provisional application No. 62/630,673, filed on Feb. 14, 2018.

(51) Int. Cl.
| | |
|---|---|
| *H01L 21/033* | (2006.01) |
| *H01L 21/311* | (2006.01) |
| *H01L 21/3105* | (2006.01) |
| *H01L 21/683* | (2006.01) |
| *H01L 21/02* | (2006.01) |
| *H01L 23/00* | (2006.01) |
| *H01L 23/528* | (2006.01) |
| *H01L 33/62* | (2010.01) |
| *H01L 21/56* | (2006.01) |
| *H01L 25/075* | (2006.01) |
| *H01L 33/38* | (2010.01) |
| *H01L 25/07* | (2006.01) |
| *H01L 23/538* | (2006.01) |
| *H01L 33/00* | (2010.01) |
| *H01L 33/06* | (2010.01) |
| *H01L 33/32* | (2010.01) |
| *H01L 21/321* | (2006.01) |

(52) U.S. Cl.
CPC ...... *H01L 21/0332* (2013.01); *H01L 21/0337* (2013.01); *H01L 21/31053* (2013.01); *H01L 21/31111* (2013.01); *H01L 21/565* (2013.01); *H01L 21/568* (2013.01); *H01L 21/6835* (2013.01); *H01L 21/7684* (2013.01); *H01L 21/76802* (2013.01); *H01L 21/76819* (2013.01); *H01L 21/76837* (2013.01); *H01L 21/76843* (2013.01); *H01L 21/76877* (2013.01); *H01L 23/528* (2013.01); *H01L 23/5384* (2013.01); *H01L 24/05* (2013.01); *H01L 24/11* (2013.01); *H01L 24/89* (2013.01); *H01L 25/072* (2013.01); *H01L 25/0753* (2013.01); *H01L 33/0093* (2020.05); *H01L 33/38* (2013.01); *H01L 33/62* (2013.01); *H01L 21/3212* (2013.01); *H01L 24/81* (2013.01); *H01L 33/007* (2013.01); *H01L 33/06* (2013.01); *H01L 33/32* (2013.01); *H01L 2221/68359* (2013.01); *H01L 2221/68363* (2013.01); *H01L 2221/68381* (2013.01); *H01L 2224/03002* (2013.01); *H01L 2224/0345* (2013.01); *H01L 2224/03462* (2013.01); *H01L 2224/03464* (2013.01); *H01L 2224/03622* (2013.01); *H01L 2224/08225* (2013.01); *H01L 2224/08501* (2013.01); *H01L 2224/80006* (2013.01); *H01L 2224/80815* (2013.01); *H01L 2224/80895* (2013.01); *H01L 2224/81005* (2013.01); *H01L 2224/81815* (2013.01); *H01L 2924/01022* (2013.01); *H01L 2924/01029* (2013.01); *H01L 2924/12041* (2013.01); *H01L 2933/005* (2013.01); *H01L 2933/0016* (2013.01); *H01L 2933/0025* (2013.01); *H01L 2933/0066* (2013.01)

(56) References Cited

U.S. PATENT DOCUMENTS

| | | | |
|---|---|---|---|
| 6,614,058 B2 | 9/2003 | Lin et al. | |
| 6,642,079 B1 | 11/2003 | Liu et al. | |
| 6,661,823 B1 | 12/2003 | Otoma et al. | |
| 7,172,945 B2 | 2/2007 | Shioga et al. | |
| 7,538,375 B2 | 5/2009 | Kim et al. | |
| 7,808,030 B2 | 10/2010 | Mizuno et al. | |
| 7,936,568 B2 | 5/2011 | Mashino | |
| 8,690,397 B2 | 4/2014 | Muraguchi | |
| 9,355,936 B2 | 5/2016 | Cooney, III et al. | |
| 9,666,522 B2 | 5/2017 | Huang et al. | |
| 9,859,218 B1 | 1/2018 | Patlolla et al. | |
| 10,262,952 B2 | 4/2019 | Chen et al. | |
| 10,497,796 B1 | 12/2019 | Cheng et al. | |
| 2001/0006528 A1 | 7/2001 | Sato et al. | |
| 2002/0086520 A1 | 7/2002 | Chiang | |
| 2003/0136997 A1 | 7/2003 | Shioga et al. | |
| 2004/0062283 A1 | 4/2004 | Takeuchi et al. | |
| 2004/0092055 A1 | 5/2004 | Liu | |
| 2005/0095781 A1 | 5/2005 | Papa Rao et al. | |
| 2007/0105265 A1 | 5/2007 | Lai et al. | |
| 2007/0222030 A1 | 9/2007 | Salama et al. | |
| 2007/0235790 A1 | 10/2007 | Kim et al. | |
| 2008/0031295 A1 | 2/2008 | Tanaka | |
| 2008/0291649 A1 | 11/2008 | Mashino | |
| 2009/0020777 A1 | 1/2009 | Iwata et al. | |
| 2009/0175307 A1 | 7/2009 | Ryu et al. | |
| 2010/0025817 A1 | 2/2010 | Mihara | |
| 2010/0051978 A1 | 3/2010 | Katsuno et al. | |
| 2010/0215070 A1 | 8/2010 | Hattori | |
| 2010/0295149 A1 | 11/2010 | Summerfelt et al. | |
| 2011/0211604 A1 | 9/2011 | Roscher | |
| 2011/0306214 A1 | 12/2011 | Zin | |
| 2012/0025370 A1 | 2/2012 | Wholey et al. | |
| 2012/0104450 A1 | 5/2012 | Chen et al. | |
| 2012/0142177 A1 | 6/2012 | Kim et al. | |
| 2012/0181562 A1 | 7/2012 | Lee et al. | |
| 2012/0266810 A1 | 10/2012 | Lan et al. | |
| 2013/0241080 A1 | 9/2013 | Pagaila | |
| 2014/0048951 A1 | 2/2014 | Lin et al. | |
| 2014/0131858 A1* | 5/2014 | Pan | H01L 24/19 257/737 |
| 2014/0209908 A1 | 7/2014 | Cooney, III et al. | |
| 2014/0217604 A1 | 8/2014 | Chou et al. | |
| 2015/0108635 A1 | 4/2015 | Liang et al. | |
| 2015/0187991 A1 | 7/2015 | McGroddy et al. | |
| 2015/0214128 A1 | 7/2015 | Lin et al. | |
| 2015/0228538 A1 | 8/2015 | Wada et al. | |
| 2015/0279776 A1 | 10/2015 | Hu et al. | |
| 2015/0357320 A1 | 12/2015 | Yu et al. | |
| 2016/0141219 A1 | 5/2016 | Liu | |
| 2016/0163578 A1 | 6/2016 | Yu et al. | |
| 2016/0268231 A1 | 9/2016 | Karhade et al. | |
| 2016/0308089 A1 | 10/2016 | Kim et al. | |
| 2017/0033026 A1 | 2/2017 | Ho et al. | |
| 2017/0133549 A1 | 5/2017 | Xu et al. | |
| 2017/0162746 A1 | 6/2017 | Cha et al. | |
| 2017/0250205 A1 | 8/2017 | Yamazaki | |
| 2018/0061697 A1 | 3/2018 | Yamada | |
| 2018/0151589 A1 | 5/2018 | Shimizu et al. | |
| 2018/0158712 A1 | 6/2018 | Ekkels et al. | |
| 2018/0211912 A1 | 7/2018 | Yu et al. | |
| 2019/0097392 A1 | 3/2019 | Cao et al. | |
| 2019/0139888 A1 | 5/2019 | Yu et al. | |
| 2019/0252312 A1 | 8/2019 | Yu et al. | |
| 2019/0273018 A1 | 9/2019 | Yu et al. | |
| 2019/0371777 A1 | 12/2019 | Iguchi | |
| 2019/0378962 A1 | 12/2019 | Yu et al. | |
| 2020/0006271 A1 | 1/2020 | Chen et al. | |
| 2020/0014169 A1 | 1/2020 | Yu et al. | |
| 2020/0219956 A1 | 7/2020 | Aoki et al. | |

FOREIGN PATENT DOCUMENTS

| | | |
|---|---|---|
| JP | 2003197463 A | 7/2003 |
| JP | 2008042118 A | 2/2008 |
| KR | 100729360 B1 | 6/2007 |
| KR | 20120121951 A | 11/2012 |
| KR | 20150012950 A | 2/2015 |
| KR | 20150137967 A | 12/2015 |
| KR | 20160083035 A | 7/2016 |
| KR | 20160124375 A | 10/2016 |
| KR | 20170015260 A | 2/2017 |
| KR | 20170064775 A | 6/2017 |

* cited by examiner

VIA FOR SEMICONDUCTOR DEVICE CONNECTION AND METHODS OF FORMING THE SAME

CROSS-REFERENCE TO RELATED APPLICATIONS

This application is a divisional of U.S. patent application Ser. No. 16/121,360, filed Sep. 4, 2018 and entitled "Via for Semiconductor Device Connection and Methods of Forming the Same," which claims the benefit of U.S. Provisional Application No. 62/630,673, filed on Feb. 14, 2018, entitled "Semiconductor Device Via and Methods of Forming the Same," which patent applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, reducing minimum feature sizes leads to additional problems that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
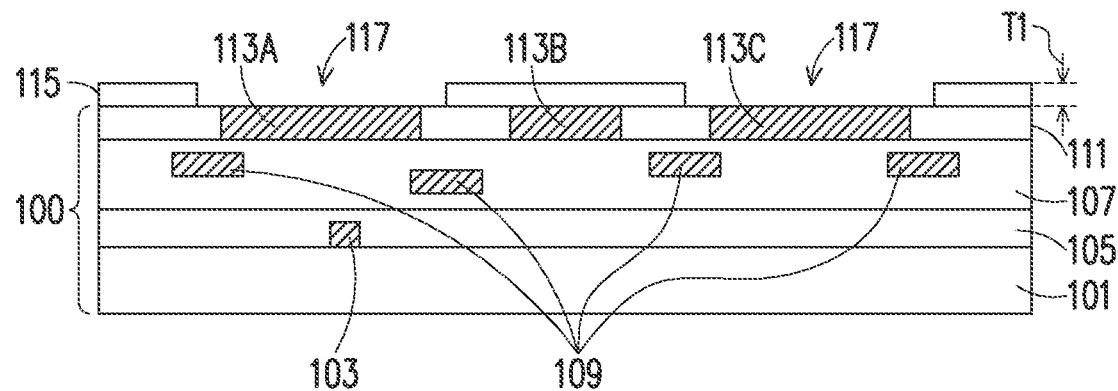
FIGS. 1 through 14 illustrate cross-sectional views of intermediate stages in the formation of a package integrated with component devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages including device dies integrated with component devices and the method of forming the same are provided in accordance with various exemplary embodiments. The intermediate stages of forming some packages are illustrated in accordance with some embodiments. Some variations of some embodiments are discussed. Throughout the various views and illustrative embodiments, like reference numbers are used to designate like elements.

FIGS. 1 through 14 illustrate the cross-sectional views of intermediate stages in the formation of a package in accordance with some embodiments of the present disclosure.

FIG. 1 illustrates a cross-sectional view of a first wafer 100 in accordance with various embodiments. In an embodiment, the first wafer 100 comprises a substrate 101 having an electrical circuit formed thereon (represented by element 103 in FIG. 1). The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, which is typically a silicon or glass substrate. Other substrates, such as a multi-layered or gradient substrate may also be used.

The electrical circuit 103 formed on the substrate 101 may be any type of circuitry suitable for a particular application. In an embodiment, the electrical circuit 103 includes electrical devices formed on the substrate 101 with one or more dielectric layers overlying the electrical devices. Metal layers may be formed between dielectric layers to route electrical signals between the electrical devices. Electrical devices may also be formed in one or more dielectric layers.

For example, the electrical circuit 103 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

FIG. 1 also shows an inter-layer dielectric (ILD) layer 105. The ILD layer 105 may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 105 may comprise a plurality of dielectric layers.

A plurality of contacts (not separately illustrated) is formed through the ILD layer 105 to provide an electrical contact to the electrical circuit 103. The contacts may be formed, for example, by using photolithography techniques to deposit and pattern a photoresist material on the ILD layer 105 to expose portions of the ILD layer 105 that are to become the contacts. An etch process, such as an anisotropic dry etch process, may be used to create openings in the ILD layer 105. The openings may be lined with a diffusion barrier layer and/or an adhesion layer (not shown), and filled with a conductive material. The diffusion barrier layer comprises one or more layers of TaN, Ta, TiN, Ti, Co, W, or the like, and the conductive material comprises copper, tungsten, aluminum, silver, and combinations thereof, or the like, thereby forming the contacts.

One or more additional inter-metal dielectric (IMD) layers 107 and interconnect lines 109 form metallization layers over the ILD layer 105. Generally, the one or more additional IMD layers 107 and the associated metallization layers are used to interconnect the electrical circuits to each other and to provide an external electrical connection. The additional IMD layers 107 may be formed of a low-K dielectric material, such as fluorosilicate glass (FSG) formed by PECVD techniques or high-density plasma chemical vapor deposition (HDPCVD) or the like, and may include intermediate etch stop layers. External contacts (not shown) may be formed in an uppermost layer.

It should also be noted that one or more etch stop layers (not separately illustrated) may be positioned between adjacent ones of the ILD layers and the IMD layers, e.g., the ILD layer 105 and the additional IMD layers 107. Generally, the etch stop layers provide a mechanism to stop an etching process when forming vias and/or contacts. The etch stop layers are formed of a dielectric material having a different etch selectivity from adjacent layers, e.g., the underlying substrate 101 and the overlying ILD layer 105 and additional IMD layers 107. In an embodiment, etch stop layers may be formed of SiN, SiCN, SiCO, CN, combinations thereof, or the like, deposited by CVD or PECVD techniques.

A first passivation layer 111 may be formed over the additional IMD layers 107 and the interconnect lines 109. The first passivation layer 111 may be a single layer or a composite layer, and may be formed of a non-porous material. In some embodiments, the first passivation layer 111 may be un-doped silicate glass (USG). In accordance with other embodiments, the first passivation layer 111 is formed of one or more layers of silicon oxide ($SiO_x$), silicon nitride (SiN), silicon oxynitride, or the like. In still further embodiments, the first passivation layer 111 is formed of a polymer layer which may be polybenzoxazole (PBO), although any suitable material, such as polyimide or a polyimide derivative, may alternatively be utilized. The first passivation layer 111 may be formed by CVD, PECVD, HDPCVD, sub-atmospheric chemical vapor deposition (SACVD), a spin-coating process, or the like.

Metal pads 113 (including a first metal pad 113A, a second metal pad 113B, and a third metal pad 113C, which are collectively referred to as metal pads 113) are formed in the first passivation layer 111, and may be electrically coupled to the electrical circuit 103, in accordance with some exemplary embodiments. The metal pads 113 may be copper pads, aluminum pads, aluminum-copper pads, other metallic pads, or the like.

In some embodiments, a first hard mask layer is deposited over the first passivation layer 111 and the metal pads 113. The first hard mask layer is patterned to form a first hard mask 115 having openings 117 formed therein. The openings 117 are disposed over and expose the first metal pad 113A and the third metal pad 113C. As illustrated in FIG. 1, the first hard mask 115 may cover the second metal pad 113B. In an embodiment, the first hard mask 115 is formed of silicon oxide ($SiO_x$); however, other materials such as silicon nitride (SiN), USG, oxides, oxynitrides, silicon carbide, combinations of these, or the like may be used. The first hard mask 115 may be a single layer, or a composite layer. The first hard mask 115 may be formed through a process such as CVD, although other processes, such as PECVD, low pressure chemical vapor deposition (LPCVD), spin-on coating, or the like, may alternatively be utilized. The first hard mask 115 may have a thickness T1 of between about 0.1 μm and about 2 μm, such as about 0.2 μm.

Figure 2:
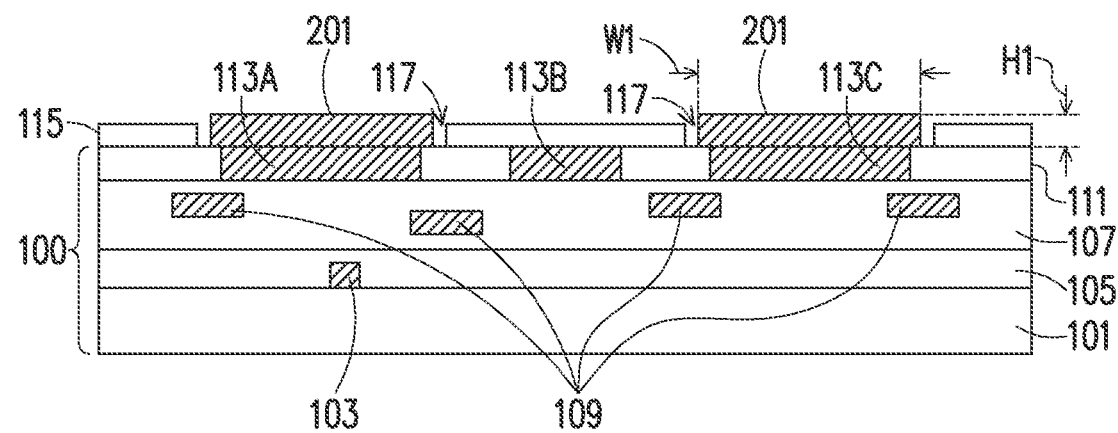

Referring to FIG. 2, an external connection material 201 is formed over the first metal pad 113A and the third metal pad 113C. The external connection material 201 may be formed of copper (Cu), a copper alloy, gold (Au), a gold alloy, indium (In), solder, a solder alloy, or the like. The external connection material 201 may have a width W1 of between about 5 μm and about 50 μm, such as about 10 μm. The external connection material 201 may have a height H1 of between about 0.2 μm and about 5 μm, such as about 0.6 μm. The external connection material 201 may be spaced apart from sidewalls of the first hard mask 115 in the openings 117, as illustrated in FIG. 2, or the external connection material 201 may contact sidewalls of the first hard mask 115.

In an embodiment in which the external connection material 201 comprises copper, a seed layer (not separately illustrated) is formed over the first hard mask 115, the first metal pad 113A, and the third metal pad 113C. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not separately illustrated) is then formed and patterned on the seed layer. The photoresist may be formed by spin-coating or the like and may be exposed to light for patterning. The pattern of the photoresist corresponds to the external connection material 201. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise copper. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the external connection material 201.

In embodiments in which the external connection material 201 comprises a reflowable material, the reflowable material may be deposited in the openings 117 and reflowed to form the external connection material 201. In some embodiments, the external connection material 201 may be provided on a second wafer 300 (discussed in detail below) in addition to or instead of on the first wafer 100.

Figure 3:
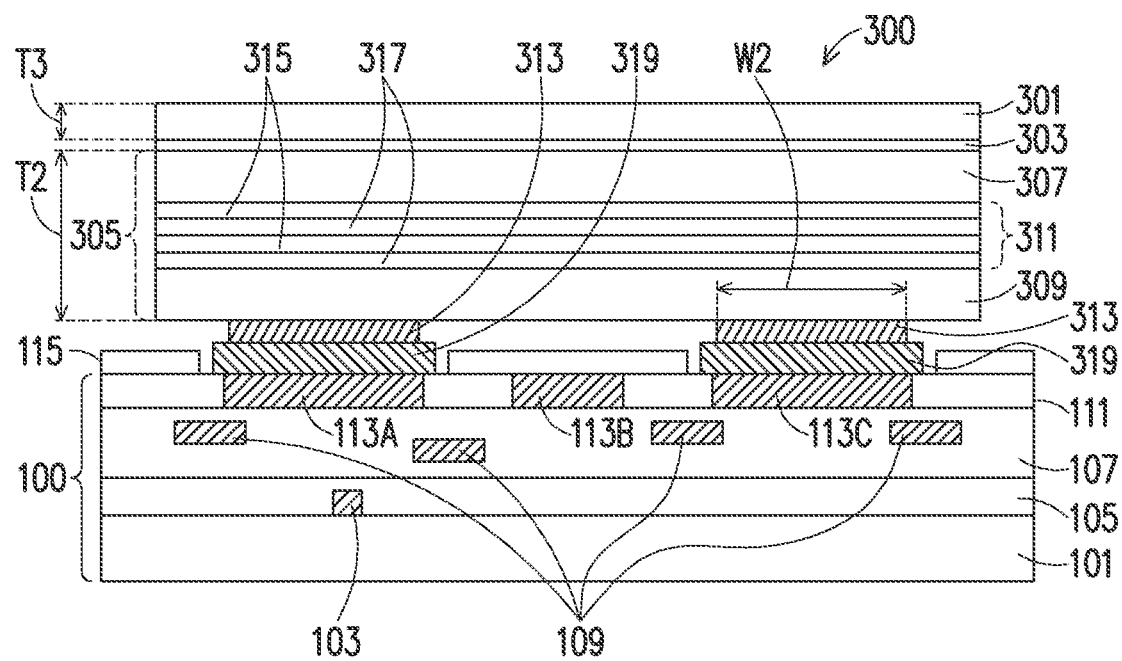

Referring to FIG. 3, a second wafer 300 is bonded to the first wafer 100. In some embodiments, the second wafer 300 comprises surface-mount devices (SMDs) or integrated passive devices (IPDs). The second wafer 300 may include one or more individual component devices (as will be discussed later). The second wafer 300 may include one or more diodes (such as light-emitting diodes (LEDs), laser diodes, photodiodes, or the like), capacitors, power amplifiers (PAs), resistors, inductors, or the like.

As illustrated in FIG. 3, the second wafer 300 includes a carrier substrate 301, an adhesive layer 303, device layers 305, and bottom terminals 313. The device layers 305 may be attached to the carrier substrate 301 through the adhesive layer 303. The bottom terminals 313 may be disposed on a side of the device layers 305 opposite the carrier substrate 301.

In some embodiments, the carrier substrate 301 may be formed of silicon (Si), germanium (Ge), silicon germanium (SiGe), and/or a III-V compound semiconductor such as gallium arsenide (GaAs), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The carrier substrate 301 may be a glass carrier substrate, a ceramic carrier substrate, or the like. The carrier substrate 301 may be a wafer, such that multiple packages can be formed on the carrier substrate 301 simultaneously. The carrier substrate 301 may have a thickness T3 of between about 50 μm and about 800 μm, such as about 200 μm.

The adhesive layer 303 may be an etch stop layer. For example, the carrier substrate 301 may be removed from the device layers 305 by performing an etch process. The etch process may be a wet etch process and may remove the carrier substrate 301 from the adhesive layer 303. The adhesive layer 303 may then be removed from the device layers 305 by an additional etch process, such as a wet etch process.

In some embodiments, the adhesive layer 303 may be formed of a polymer-based material. In certain embodiments, the adhesive layer 303 is an epoxy-based thermal-release material, which loses its adhesive property when heated, such as a light-to-heat-conversion (LTHC) release coating. In other embodiments, the adhesive layer 303 may be an ultra-violet (UV) glue, which loses its adhesive property when exposed to UV light. In embodiments in which the adhesive layer 303 is formed of a LTHC release coating or a UV glue, the carrier substrate 301 may be removed from the device layers 305 by exposing the adhesive layer 303 to heat or UV light, respectively. The adhesive layer 303 may be dispensed as a liquid and cured, may be a laminate film laminated onto the carrier substrate 301, or may be the like. The top surface of the adhesive layer 303 may be leveled and may have a high degree of co-planarity.

The device layers 305 may include various metal layers, dielectric layers, and III-V epitaxial layers (i.e., semiconductive layers), which make up the various devices included in the second wafer 300. The device layers 305 may have a combined thickness T2 of between about 1 μm and about 30 μm, such as about 10 μm.

In embodiments in which the second wafer 300 includes LEDs, the device layers 305 may include a p-type doped semiconductor layer 307, an n-type doped semiconductor layer 309, and a multiple quantum well (MQW) 311. The n-type doped semiconductor layer 309 may be disposed adjacent to and in contact with the bottom terminals 313, as illustrated in FIG. 3. In other embodiments, the p-type doped semiconductor layer 307 and the n-type doped semiconductor layer 309 may be switched such that the p-type doped semiconductor layer 307 is disposed adjacent to and in contact with the bottom terminals 313. The p-type doped semiconductor layer 307 and the n-type doped semiconductor layer 309 may be configured as a PN junction designed to emit light during operation.

In some embodiments, the MQW 311 includes a stack of two alternating semiconductor material films 315 and 317. In one embodiment, the two semiconductor material films 315 and 317 include a layer of indium gallium nitride (InGaN) and a layer of gallium nitride (GaN), respectively. Various semiconductor layers can be grown by proper epitaxy growth technique. In one example, the epitaxial semiconductor layers are deposited by metal organic chemical vapor deposition (MOCVD) or the like.

In embodiments in which the external connection material 201 comprises a reflowable material, the second wafer 300 may be bonded to the first wafer 100 by reflowing the external connection material 201 to form external connectors 319 which bond the first metal pad 113A and the third metal pad 113C to the bottom terminals 313. In embodiments in which the external connection material 201 comprises copper, the second wafer 300 may be bonded to the first wafer 100 by forming metal-to-metal direct bonds between the external connection material 201 and the bottom terminals 313. As such, the bottom terminals 313 may be physically bonded and electrically connected to the first metal pad 113A and the third metal pad 113C through the bottom terminals 313. In some embodiments, the external connection material 201 may be omitted and the first metal pad 113A and the third metal pad 113C may be bonded to the bottom terminals 313 through direct metal-to-metal bonding (such as copper-to-copper bonding or gold-to-gold bonding), hybrid bonding, or the like. The first hard mask 115 may also be omitted. The bottom terminals 313 may have widths W2 of between about 3 μm and about 45 μm, such as about 8 μm.

Figure 4:
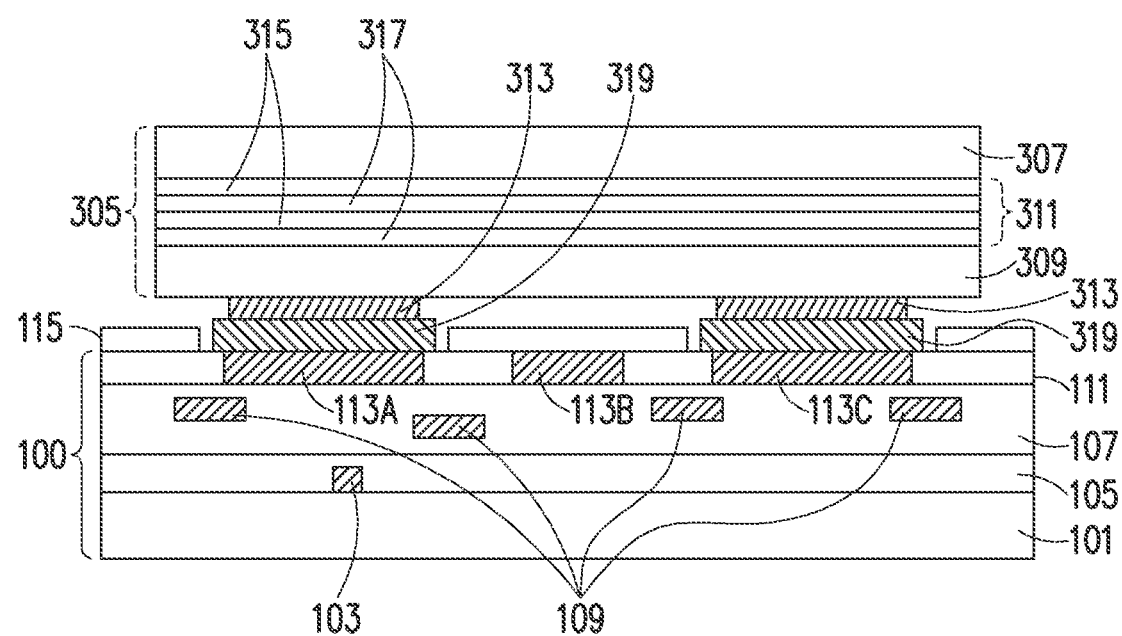

Referring to FIG. 4, the carrier substrate 301 and the adhesive layer 303 are removed from the second wafer 300. As discussed above, the carrier substrate 301 and the adhesive layer 303 may be removed by performing a first etch process and a second etch process, respectively, or by exposing the adhesive layer 303 to heat, UV light, or the like.

Figure 5:
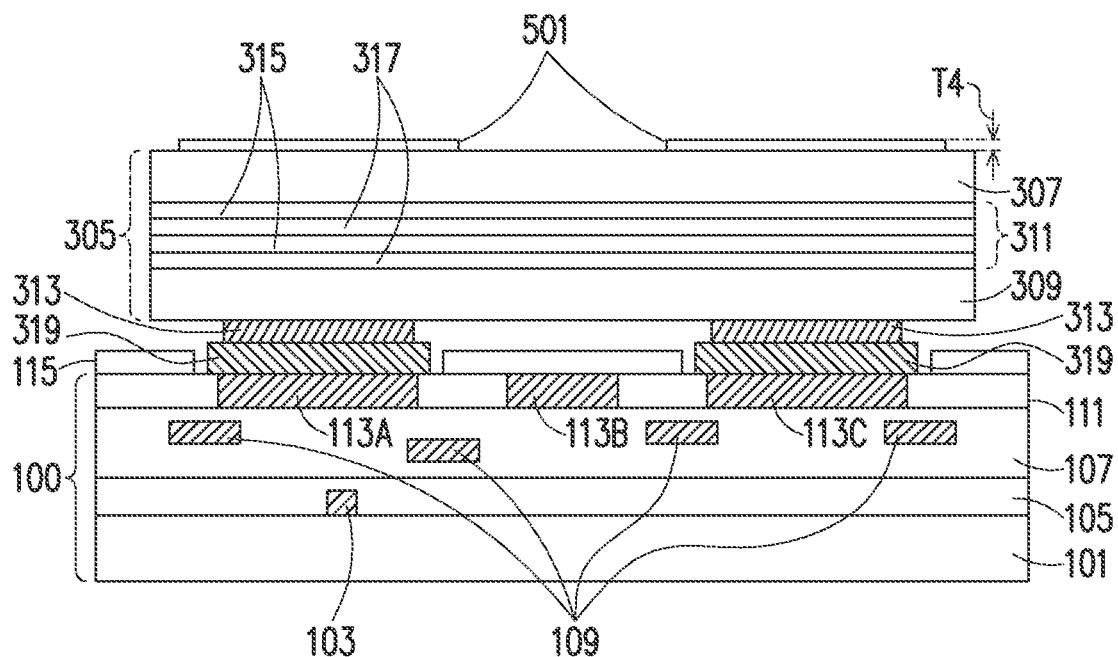

Referring to FIG. 5, a second hard mask layer is deposited over the second wafer 300 and patterned to form a second hard mask 501. The second hard mask 501 may be formed of silicon nitride, silicon oxide, or the like. The second hard mask 501 may be a single layer, or a composite layer. The second hard mask 501 may be formed through a process such as CVD, although other processes, such as PECVD, LPCVD, spin-on coating, or the like, may alternatively be utilized. The second hard mask may have a thickness T4 of between about 0.2 μm and about 5 μm, such as about 2 μm.

Figure 6:
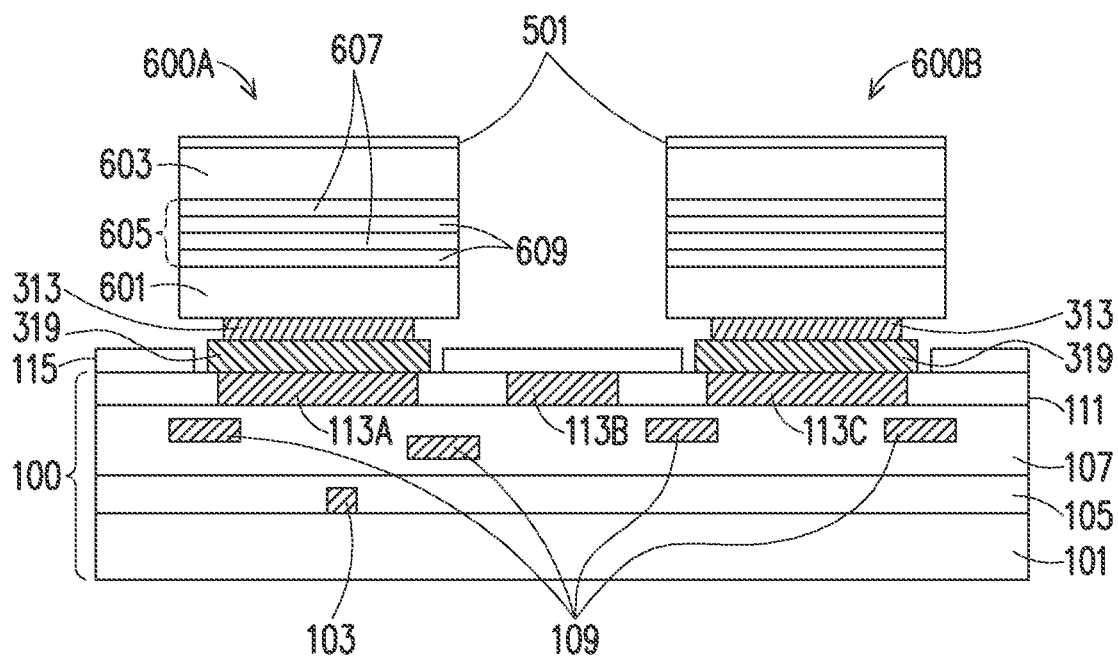

Referring to FIG. 6, the p-type doped semiconductor layer 307, the MQW 311, and the n-type doped semiconductor layer 309 of the device layers 305 are etched to form a first component device 600A and a second component device 600B (collectively referred to as component devices 600). The second hard mask 501 serves as a mask such that portions of the device layers 305 underlying the second hard mask 501 are not etched. The first hard mask 115 serves as an etch stop layer such that portions of the first wafer 100 underlying the first hard mask 115 are not etched. The device layers 305 may be etched, for example, by a dry etch process.

In embodiments in which the first component device 600A and the second component device 600B are formed, the second wafer 300 may include two or more component devices. Each of the first component device 600A and the second component device 600B may be a single-component device or a multiple-component device. In some embodiments, the first component device 600A and the second component device 600B include one or more diodes (e.g., a light-emitting diode (LED), a laser diode, a photodiode or the like), as illustrated in FIG. 6. In other embodiments, the first component device 600A and the second component device 600B may be capacitors, PAs, resistors, inductors, or the like therein, as described above in reference to the second wafer 300. In embodiments in which the component devices 600 comprise LEDs, each of the component devices 600 may include an n-type doped semiconductor layer 603, a MQW 605, and a p-type doped semiconductor layer 601 similar to the elements described above in reference to FIG. 3. The MQW 605 includes a stack of two alternating semiconductor material films 607 and 609.

Figure 7:
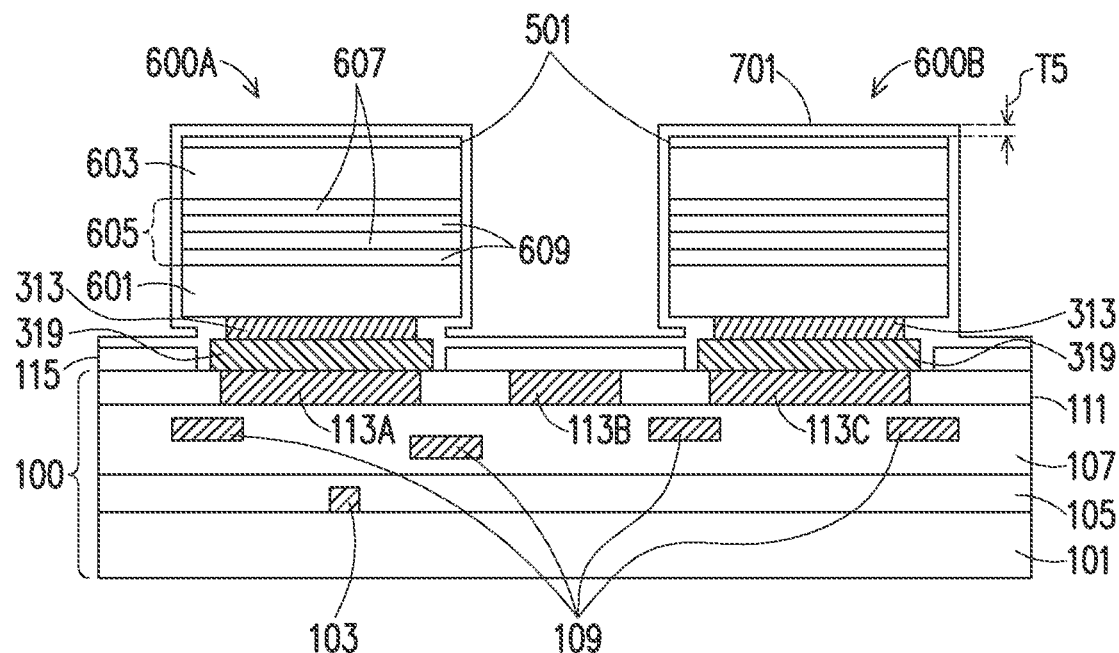

Referring to FIG. 7, a protection layer 701 is formed over the first component device 600A, the second component device 600B, the first hard mask 115, and the second hard mask 501. The protection layer 701 may be deposited by atomic layer deposition (ALD), CVD, PECVD, LPCVD, a spin-coating process, or the like. As illustrated in FIG. 7, the protection layer 701 may be formed conformally over the first component device 600A, the second component device 600B, the first hard mask 115, and the second hard mask 501. The protection layer 701 may be formed of a dielectric material. For example, the protection layer 701 may be formed of aluminum oxide ($Al_2O_3$), aluminum nitride (AlN), silicon nitride (SiN), silicon oxide ($SiO_x$), the like, or a combination thereof. In other embodiments, the protection layer 701 is formed of a polymer layer which may be polybenzoxazole (PBO), although any suitable material, such as polyimide or a polyimide derivative, may alternatively be utilized. The protection layer 701 may be a single layer or multiple layers. According to some embodiments, the protection layer 701 is formed of a silicon oxide layer overlying a silicon nitride layer. The protection layer 701 may have a thickness T5 of between about 0.05 μm and about 0.2 μm, such as about 0.1 μm.

Figure 8:
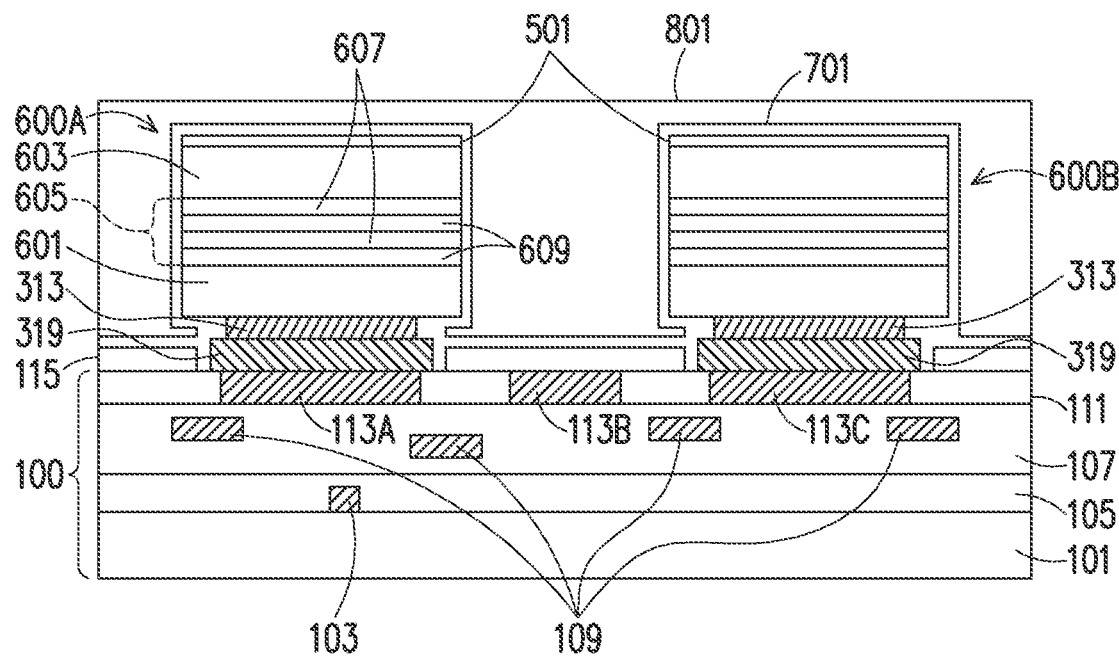

Referring to FIG. 8, a gap fill material 801 is formed over the protection layer 701 and the gap fill material 801 is subsequently planarized. In some embodiments, the gap fill material 801 is formed of silicon oxide ($SiO_x$). In other embodiments, the gap fill material 801 is formed of silicon nitride (SiN) or the like. The gap fill material 801 may be formed by CVD, PECVD, ALD, flowable chemical vapor deposition (FCVD), a spin-on process, or the like. The gap fill material 801 may then be planarized by a process such as a chemical mechanical polishing (CMP). As illustrated in FIG. 8, the gap fill material 801 may be planarized such that a top surface of the gap fill material 801 is disposed above top surfaces of the second hard mask 501 over the first component device 600A and the second component device 600B.

Figure 9:
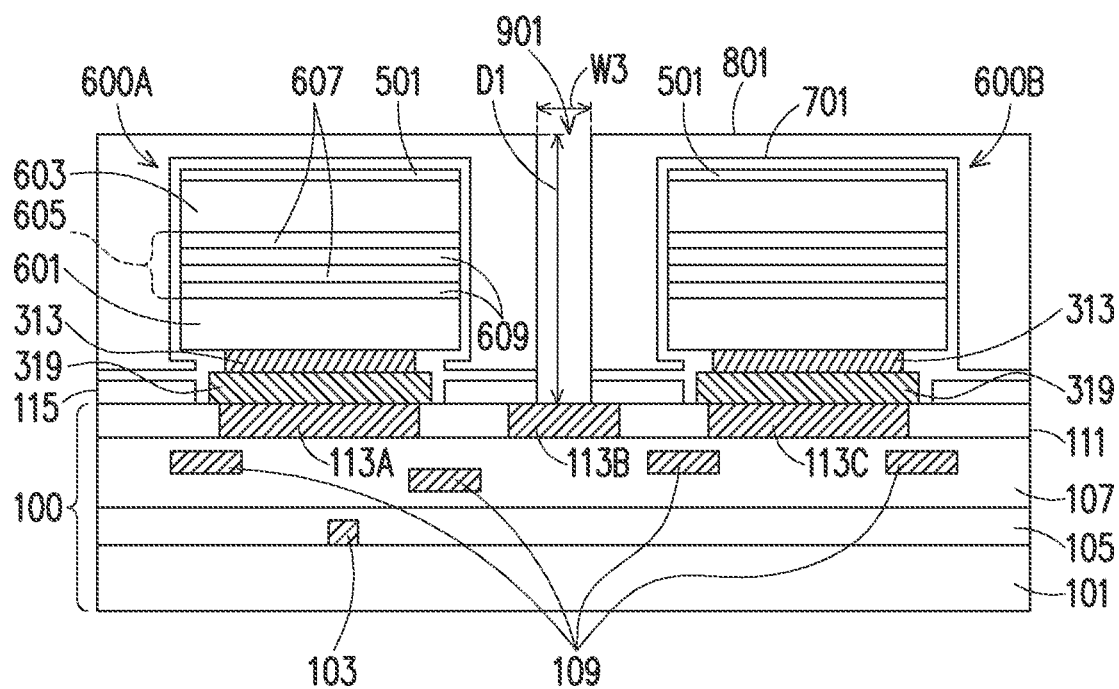

Referring to FIG. 9, an opening 901 is formed in the gap fill material 801. The opening 901 may be formed by depositing a photoresist (not separately illustrated) over the gap fill material 801, patterning the photoresist, and dry etching the gap fill material 801. The opening 901 may extend down to the second metal pad 113B. In some embodiments, as illustrated in FIG. 9, the second metal pad 113B may be etched such that a recess is formed in the topmost surface of the second metal pad 113B. The recess may have a depth of between about 0.5 nm and about 50 nm, such as about 5 nm. The opening 901 may have a width W3 of between about 0.5 μm and about 10 μm, such as about 1 μm. The opening 901 may have a depth D1 of between about 3 μm and about 25 μm, such as about 14 μm. As such, the opening 901 may have an aspect ratio of between about 1 and about 12, such as about 5. The photoresist may be removed by stripping, ashing, or the like.

Figure 10:
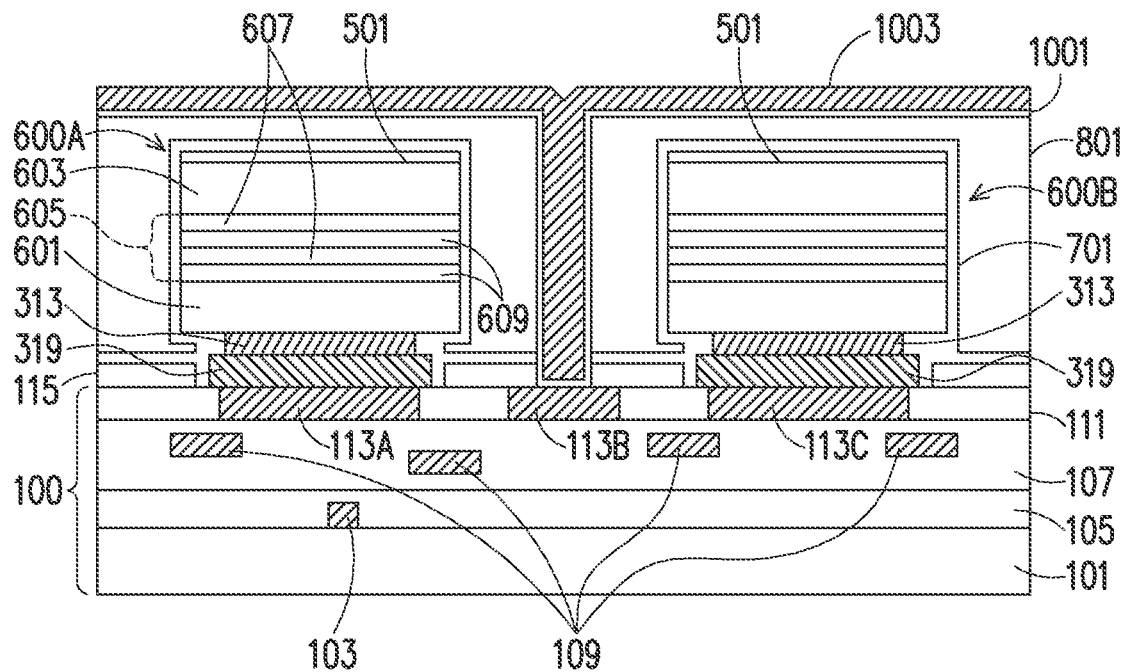

Referring to FIG. 10, a barrier layer 1001 is deposited over the gap fill material 801 and the second metal pad 113B and an electrode material 1003 is deposited over the barrier layer 1001. The barrier layer 1001 may be formed of titanium (Ti), titanium nitride (TiN), tantalum nitride (TaN), combinations thereof, or the like. The barrier layer 1001 may be a single layer or multiple layers. The electrode material 1003 may be formed of copper (Cu), tungsten (W), aluminum (Al), combinations thereof, or the like. The barrier layer 1001 may be deposited by sputtering. The electrode material 1003 may be plated onto the surface of the barrier layer 1001. The barrier layer 1001 may be a metal diffusion barrier and may prevent the diffusion of metals from the electrode material 1003 into the gap fill material 801.

Figure 11:
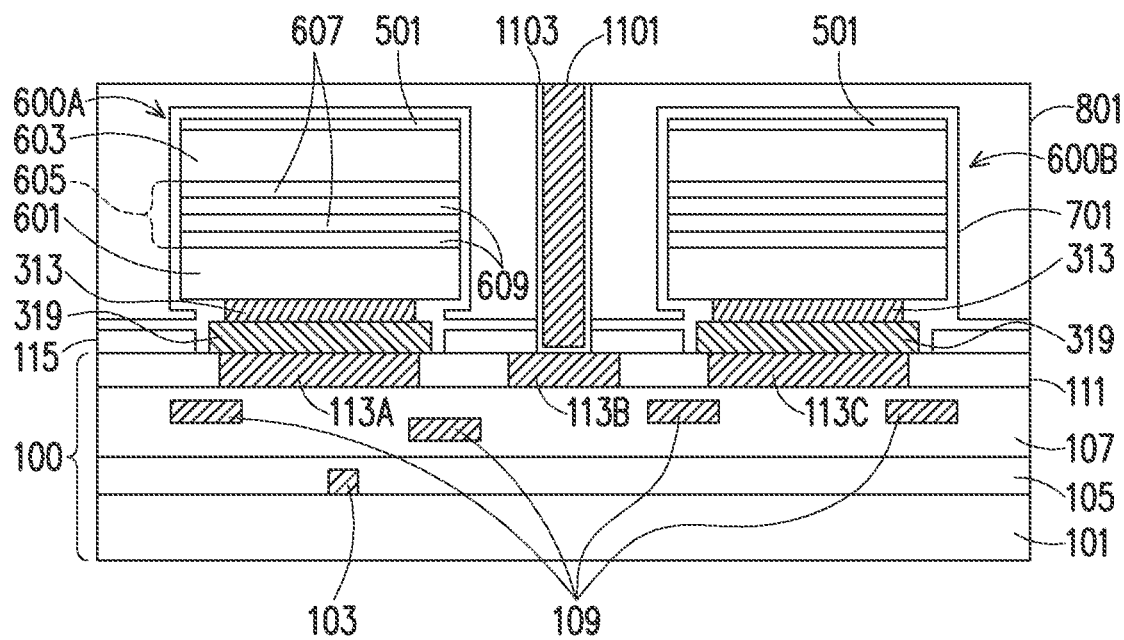

Referring to FIG. 11, the electrode material 1003 and the barrier layer 1001 may be planarized to form a via 1101 and a barrier 1103. The via 1101 may be used to connect a subsequently formed terminal (e.g., a top terminal 1301, discussed below in reference to FIG. 13) to the second metal pad 113B. As such, the via 1101 may be electrically connected to the second metal pad 113B. Top surfaces of the via 1101 and the barrier 1103 may be co-planar with a top surface of the gap fill material 801. The via 1101 and the barrier 1103 may be planarized using a CMP process. The gap fill material 801 may also be planarized by the CMP process.

Figure 12:
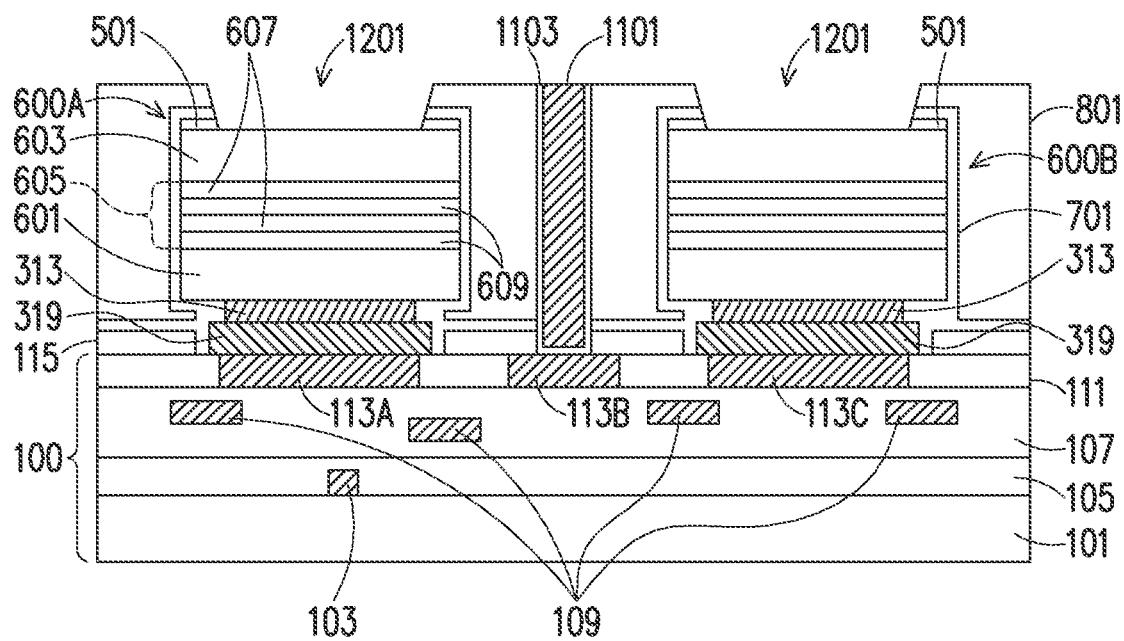

Referring to FIG. 12, third openings 1201 are formed in the gap fill material 801, the protection layer 701, and the second hard mask 501. The third openings 1201 expose the n-type doped semiconductor layer 603 and may be provided in order to connect subsequently formed terminals (e.g., a top terminal 1301, discussed below in reference to FIG. 13) to the component devices 600. The third openings 1201 may be formed by depositing a photoresist (not separately illustrated) over the gap fill material 801, the via 1101, and the barrier 1103. The photoresist is then patterned and the gap fill material 801, the protection layer 701, and the second hard mask 501 etched by an etching process such as a dry etch. The gap fill material 801, the protection layer 701, and the second hard mask 501 may be dry etched by one or more dry etching processes. The photoresist is then removed by stripping, ashing, or the like.

Figure 13:
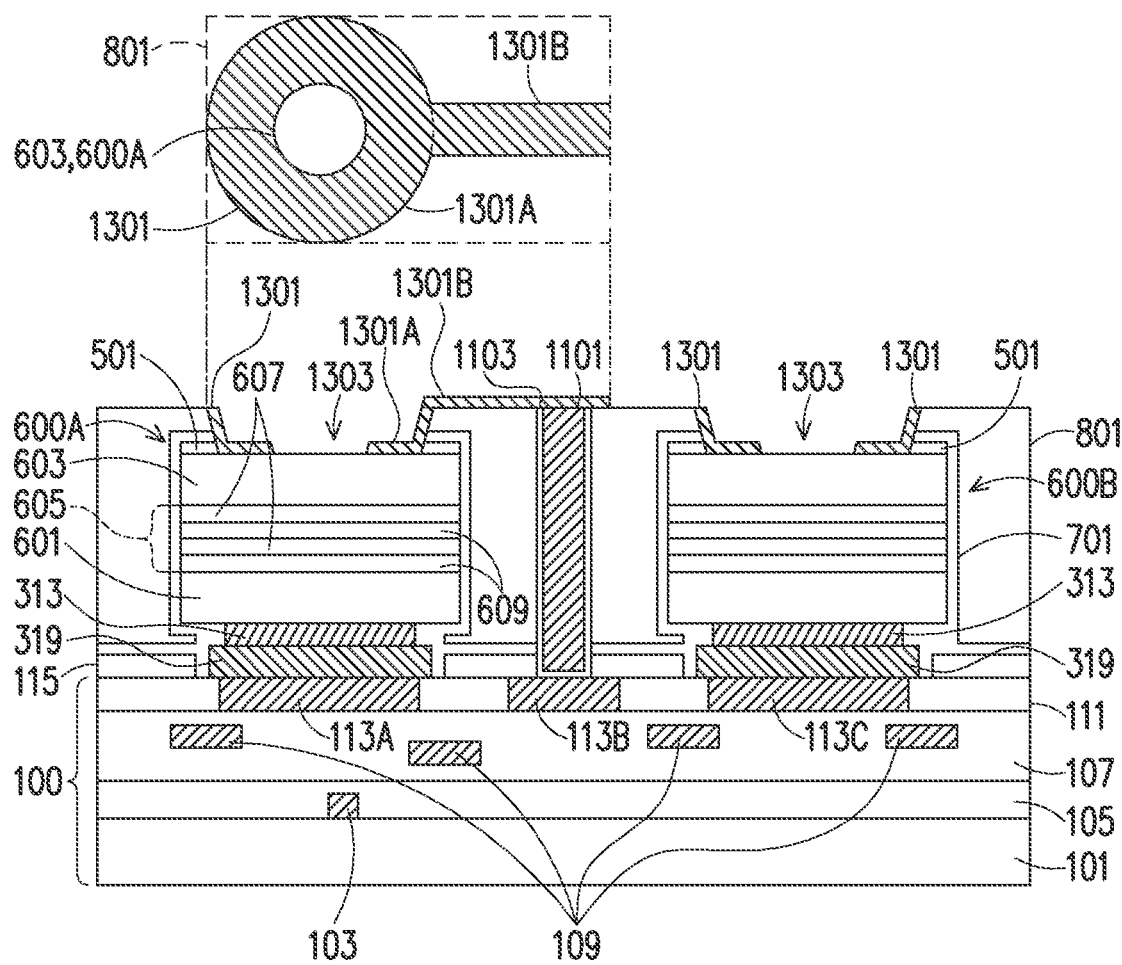

Referring to FIG. 13, top terminals 1301 are formed over the first component device 600A and the second component device 600B. The top terminals 1301 may be formed of copper (Cu), titanium (Ti), platinum (Pt), silver (Ag), aluminum (Al), gold (Au), alloys thereof, or the like. The top terminals 1301 may be formed by depositing a seed layer (not separately illustrated) over the gap fill material 801, the protection layer 701, the second hard mask 501, and the component devices 600. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist (not separately illustrated) is then formed and patterned on the seed layer. The photoresist may be formed by spin-coating or the like and may be exposed to light for patterning. The pattern of the photoresist corresponds to the top terminals 1301. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise copper. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the top terminals 1301. In some embodiments, the top terminals 1301 may be formed by evaporation deposition.

In some embodiments, the top terminals 1301 include a first portion 1301A and a second portion 1301B. The first portion 1301A may be formed in the third opening 1201 and may be disposed below a top surface of the gap fill material 801. The second portion 1301B may extend from the first portion 1301A over the gap fill material to the via 1101. The first portion 1301A may be connected to the n-type doped semiconductor layers 603 of the component devices 600. The first portion 1301A may include a recess 1303. FIG. 13 includes a top-down view of one of the top terminals 1301 including a recess 1303. As illustrated in FIG. 13, the first portion 1301A may have a ring shape, with a circular recess 1303 disposed therein. In embodiments in which the component devices 600 are LEDs, laser diodes, or photo diodes, the recesses 1303 may allow light to pass through the top terminals 1301 to/from the component devices 600. In other embodiments, the recesses 1303 may be square, rectangular, polygonal, or any other suitable shape in top-down view. In embodiments in which the first component device 600A and the second component device 600B include capacitors, resistors, or the like, the top terminals 1301 may extend completely across the bottom surfaces of the third openings 1201.

The second portion 1301B may be physically and electrically connected to the first portion 1301A and the via 1101 and may serve to electrically connect the first portion 1301A to the via 1101. The first portion 1301A and the second portion 1301B may be formed simultaneously, or the first portion 1301A and the second portion 1301B may be formed in a two-step process in which the first portion 1301A is formed, then the second portion 1301B is formed. Although not shown in FIG. 13, the second component device 600B may also be connected to the second metal pad 113B or other metal pads through second portions 1301B of the top terminals 1301, disposed into or out from the page, or in another direction.

Figure 14:
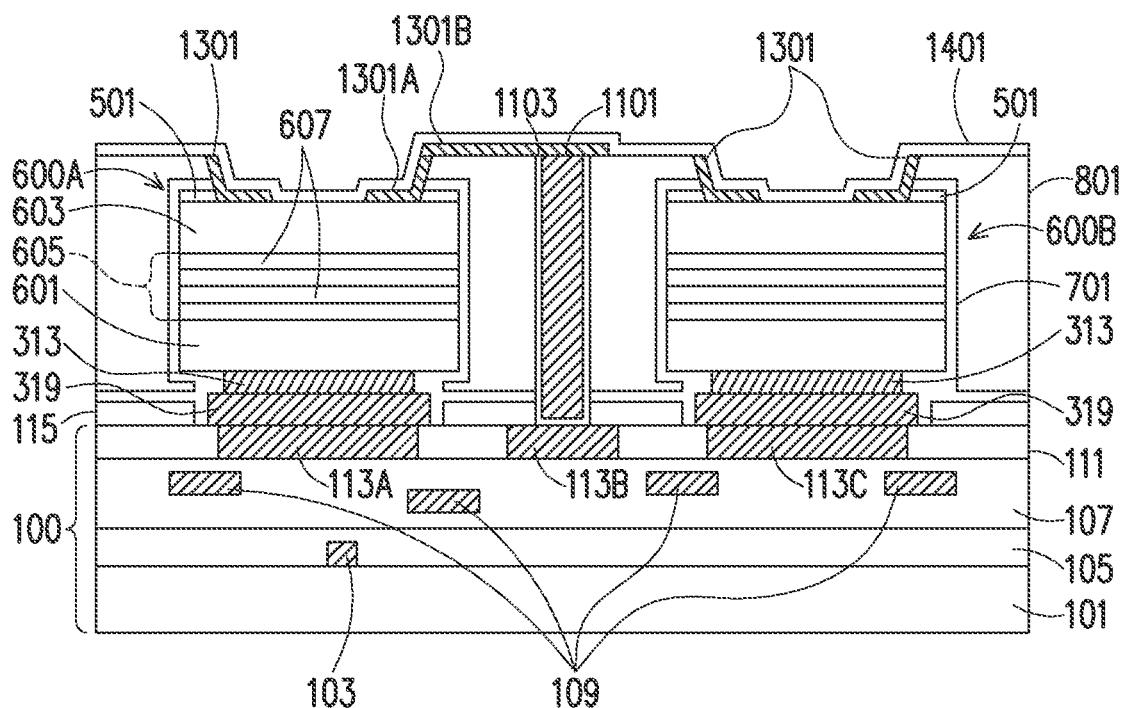

Referring to FIG. 14, a second passivation layer 1401 may be deposited over the gap fill material 801, the top terminals 1301, the first component device 600A, and the second component device 600B. The second passivation layer 1401 may be formed of silicon nitride (SiN), silicon oxide (SiO$_x$), combinations or multiple layers thereof, or the like. In other embodiments, the second passivation layer 1401 is formed of a polymer layer which may be polybenzoxazole (PBO), although any suitable material, such as polyimide or a polyimide derivative, may alternatively be utilized. The second passivation layer 1401 may be formed of a material that is optically transparent to certain wavelengths of light. For example, in embodiments in which the first component device 600A and the second component device 600B are LEDs, laser diodes, photo diodes, or the like, the second passivation layer 1401 may be formed of a material that is optically transparent to light of the wavelength produced or received by the component devices 600.

According to various embodiments, the bottom terminals 313 of the first component device 600A and the second component device 600B may be connected to the first wafer 100 directly by metal-to-metal bonding or hybrid bonding or through the external connectors 319, by solder bonding, metal-to-metal bonding, or by hybrid bonding. The top terminals 1301 of the first component device 600A and the second component device 600B may be connected to the first wafer 100 through the via 1101. This may allow for component devices having small widths to be connected to a wafer. For example, component devices having widths of less than 50 µm, such as 10 µm to 50 µm, may be connected to the wafer. Moreover, the methods and devices of the present disclosure provide better integration for use in silicon. Additionally, multiple component devices on a single chip may be bonded to a wafer and processed simultaneously. Furthermore, the vias may be formed extending to the same metal layer on which the component devices are to bonded, reducing manufacturing costs.

FIGS. 15 through 23 illustrate the cross-sectional views of intermediate stages in the formation of a package in accordance with some embodiments of the present disclosure.

Figure 15:
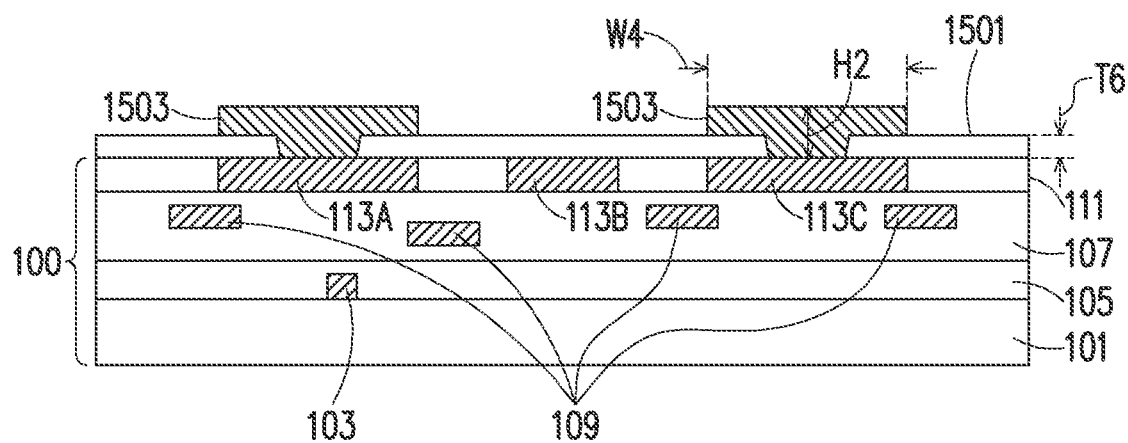
FIGS. 15 through 23 illustrate cross-sectional views of intermediate stages in the formation of a package integrated with component devices, in accordance with some embodiments.

FIG. 15 illustrates a cross-sectional view of a first wafer 100, in accordance with another embodiment. The first wafer 100 may be the same as or similar to the first wafer 100 of the first embodiment, illustrated in FIG. 1. For example, the first wafer 100 may include a substrate 101, an electrical circuit 103, an ILD layer 105, additional IMD layers 107, interconnect lines 109, a first passivation layer 111, a first metal pad 113A, a second metal pad 113B, and a third metal pad 113C (collectively referred to as metal pads 113).

A first hard mask layer is deposited over the first passivation layer 111 and the metal pads 113. The first hard mask layer is patterned to form a first hard mask 1501 having openings formed therein. The openings are disposed over and expose portions of the first metal pad 113A and the third metal pad 113C. In some embodiments, the openings may be formed to expose entire top surfaces of the first metal pad 113A and the third metal pad 113C. In other embodiments, the openings may be formed to expose top surfaces of the first metal pad 113A, the third metal pad 113C, and portions of the first passivation layer 111. The first hard mask 1501 may cover the second metal pad 113B. In an embodiment, the first hard mask 1501 is formed of silicon oxide; however, other materials such as silicon nitride, oxides, oxynitrides, silicon carbide, combinations of these, or the like may be used. The first hard mask 1501 may be a single layer, or a composite layer. The first hard mask 1501 may be formed through a process such as CVD, although other processes, such as PECVD, LPCVD, spin-on coating, or the like, may alternatively be utilized. The first hard mask 1501 may have a thickness T6 of between about 0.1 µm and about 2 µm, such as about 0.2 µm.

An external connection material 1503 is formed over the first metal pad 113A and the third metal pad 113C. The external connection material 1503 may be formed of copper (Cu), a copper alloy, gold (Au), a gold alloy, indium (In), solder, a solder alloy, or the like. The external connection material 1503 may have a width W4 of between about 5 µm and about 50 µm, such as about 10 µm. The external connection material 1503 may have a height H2 of between about 0.2 µm and about 5 µm, such as about 0.6 µm. The external connection material 1503 may be deposited in the openings formed in the first hard mask 1501 and may contact sidewalls of the first hard mask 1501. In other embodiments, the external connection material 1503 may be spaced apart from the sidewalls of the first hard mask 1501. The external connection material 1503 may extend over at least a portion of the first hard mask 1501.

In an embodiment in which the external connection material 1503 comprises copper, a seed layer (not separately illustrated) is formed over the first hard mask 115, the first metal pad 113A, and the third metal pad 113C. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not separately illustrated) is then formed and patterned on the seed layer. The photoresist may be formed by spin-coating or the like and may be exposed to light for patterning. The pattern of the photoresist corresponds to the external connection material 1503. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise copper. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the external connection material 1503.

In embodiments in which the external connection material 1503 comprises a reflowable material, the reflowable material may be deposited in the openings and reflowed to form the external connection material 1503. In some embodiments, the external connection material 1503 may be provided on component devices 1600 (discussed in detail below) in addition to or instead of on the first wafer 100.

Figure 16:
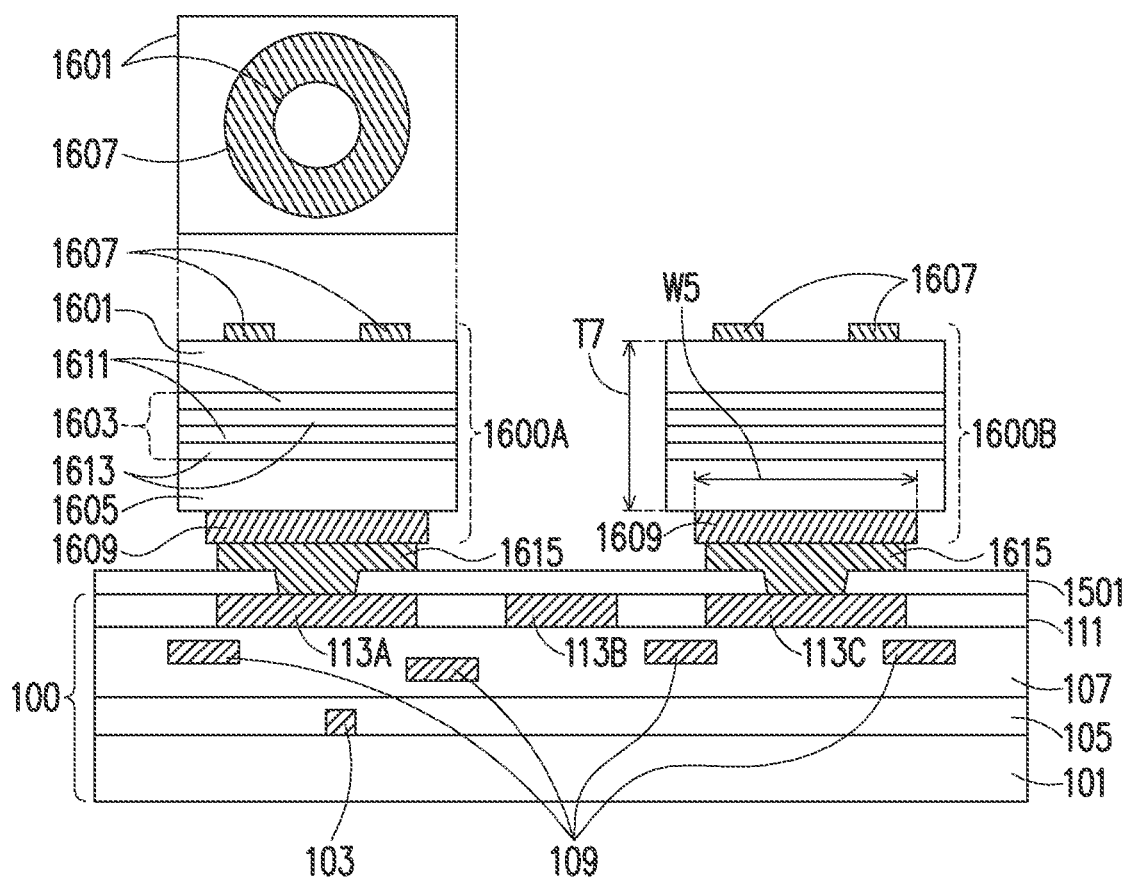

Referring to FIG. 16, a first component device 1600A and a second component device 1600B (collectively referred to as the component devices 1600) are bonded to the first wafer 100. The component devices 1600 may be referred to as SMDs, or IPDs. The component devices 1600 may include one or more diodes (such as LEDs, laser diodes, photodiodes, or the like), capacitors, PAs, resistors, inductors, or the like.

The component devices 1600 may be the same as, or similar to the component devices 600, described above in reference to FIG. 6. Each of the component devices 1600 may include a top terminal 1607, an n-type doped semiconductor layer 1601, an MQW 1603, a p-type doped semiconductor layer 1605, and a bottom terminal 1609. The n-type doped semiconductor layer 1601, the MQW 1603, and the p-type doped semiconductor layer 1605 may have a combined thickness T7 of between about 1 µm and about 30 µm, such as about 10 µm. The MQW 1603 includes a stack of two alternating semiconductor material films 1611 and 1613.

The top terminals 1607 may be used to connect the component devices 1600 to the second metal pad 113B (as described later in reference to FIG. 22) and the bottom terminals 1609 may be used to connect the component devices to the first metal pad 113A and the third metal pad 113C. The top terminals 1607 and the bottom terminals 1609 may be disposed at different planes. For example, the top terminals 1607 may be disposed at top surfaces of the component devices 1600 and the bottom terminals 1609 may be disposed at bottom surfaces of the component devices 1600. The bottom terminals 1609 may have widths W5 of between about 3 µm and about 45 µm, such as about 8 µm.

FIG. 16 includes a top-down view of the first component device 1600A. As illustrated in FIG. 16, the top terminal 1607 of the first component device 1600A may have a ring-shape in the top-down view. In embodiments in which the component devices 1600 are LEDs, laser diodes, or photo diodes, the ring-shaped top terminal 1607 may allow light to pass through the top terminals 1607 to/from the component devices 1600. In other embodiments, the top terminals 1607 may be square, rectangular, polygonal, or any other suitable shape in the top-down view and recesses formed in the top terminals 1607 may be shaped accordingly. In embodiments in which the component devices 1600 include capacitors, resistors, or the like, the top terminals 1607 be solid or continuous without a recess formed therein and may be circular, oval, square, rectangular, polygonal, or have any other suitable shape in the top-down view.

In embodiments in which the external connection material 1503 (illustrated in FIG. 15) comprises a reflowable material, the component devices 1600 may be bonded to the first wafer 100 by reflowing the external connection material 1503 to form external connectors 1615 which bond the bottom terminals 1609 of the first component device 1600A and the second component device 1600B to the first metal pad 113A and the third metal pad 113C, respectively. In embodiments in which the external connection material 1503 comprises copper, the component devices 1600 may be bonded to the first wafer 100 by forming metal-to-metal direct bonds between the external connection material 1503 and the bottom terminals 1609. As such, the bottom terminals 1609 may be physically bonded and electrically connected to the first metal pad 113A and the third metal pad 113C through the bottom terminals 1609. In some embodiments, the external connection material 1503 may be omitted and the first metal pad 113A and the third metal pad 113C may be bonded to the bottom terminals 1609 through direct metal-to-metal bonding (such as copper-to-copper bonding or gold-to-gold bonding), hybrid bonding, or the like. The first hard mask 1501 may also be omitted.

Figure 17:
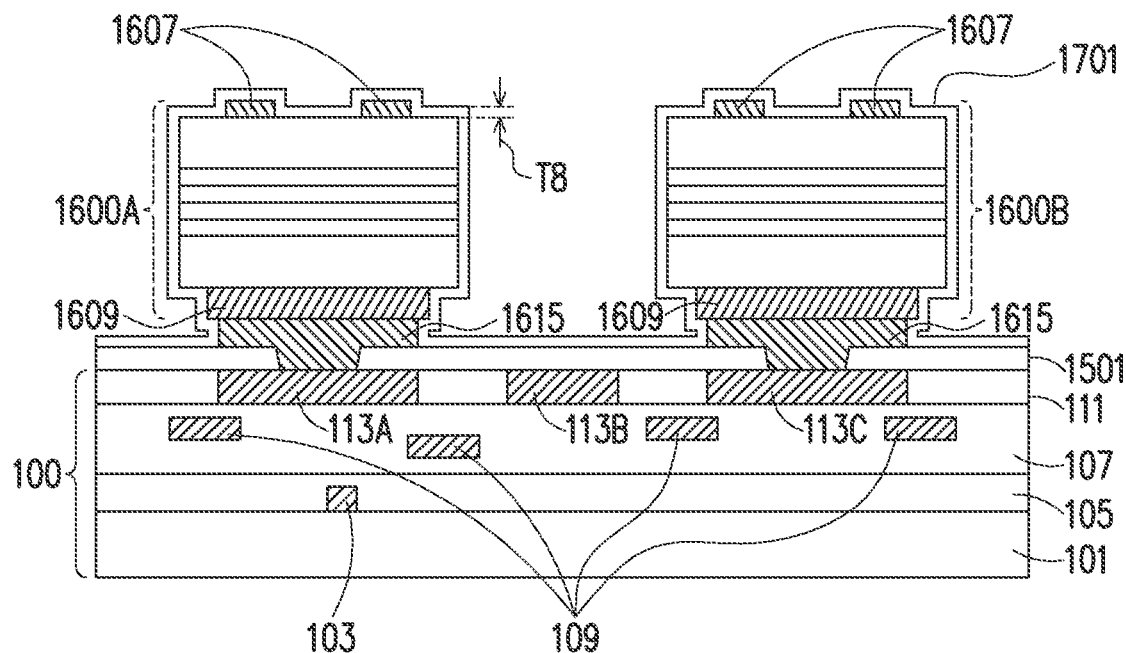

Referring to FIG. 17, a protection layer 1701 is formed over the first component device 1600A, the second component device 1600B, the external connectors 1615, and the first hard mask 1501. The protection layer 1701 may be deposited by ALD, CVD, PECVD, LPCVD, or the like. As illustrated in FIG. 17, the protection layer 1701 may be formed conformally over the first component device 1600A, the second component device 1600B, the external connectors 1615, and the first hard mask 1501. The protection layer 1701 may be formed of a dielectric material. For example, the protection layer 1701 may be formed of aluminum oxide ($Al_2O_3$), aluminum nitride (AlN), silicon nitride (SiN), silicon oxide ($SiO_x$), the like, or a combination thereof. The protection layer 1701 may be a single layer or multiple layers. According to some embodiments, the protection layer 1701 is formed of a silicon oxide layer overlying a silicon nitride layer. The protection layer 1701 may have a thickness T8 of between about 0.05 µm and about 0.2 µm, such as about 0.1 µm.

Figure 18:
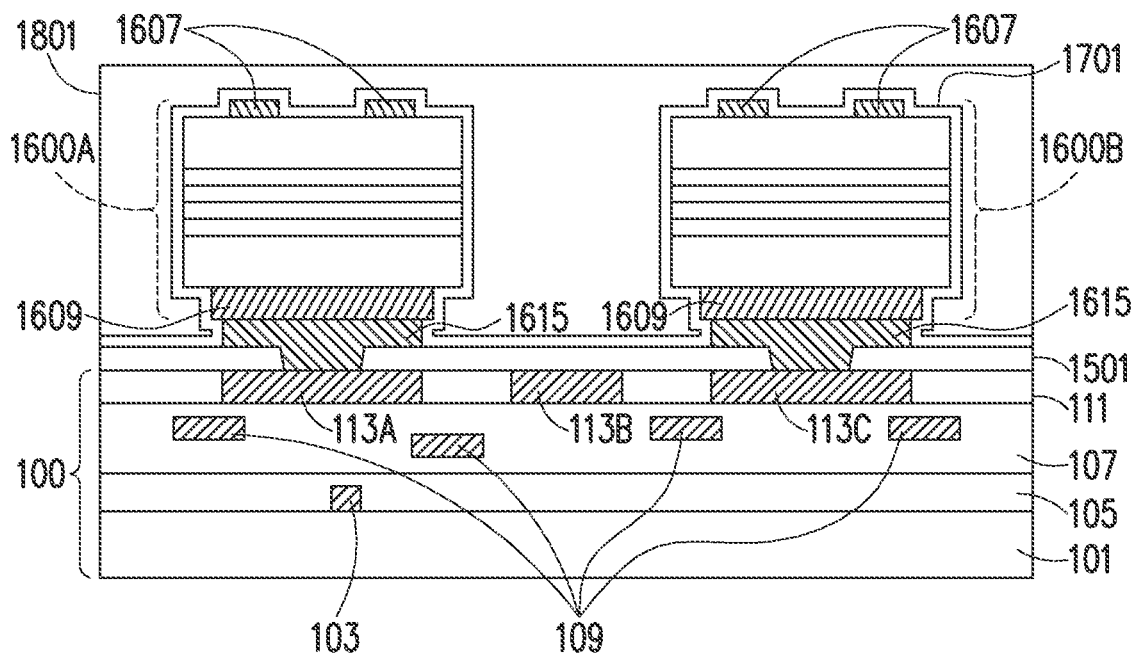

Referring to FIG. 18, a gap fill material 1801 is formed over the protection layer 1701 and the gap fill material 1801 is subsequently planarized. In some embodiments, the gap fill material 1801 is formed of silicon oxide ($SiO_x$). In other embodiments, the gap fill material 1801 is formed of silicon nitride (SiN) or the like. The gap fill material 1801 may be formed by CVD, PECVD, ALD, FCVD, a spin-on process, or the like. The gap fill material 1801 may be planarized by a CMP process. As illustrated in FIG. 18, the gap fill material 1801 may be planarized such that a top surface of the gap fill material 1801 is disposed above top surfaces of the top terminals 1607.

Figure 19:
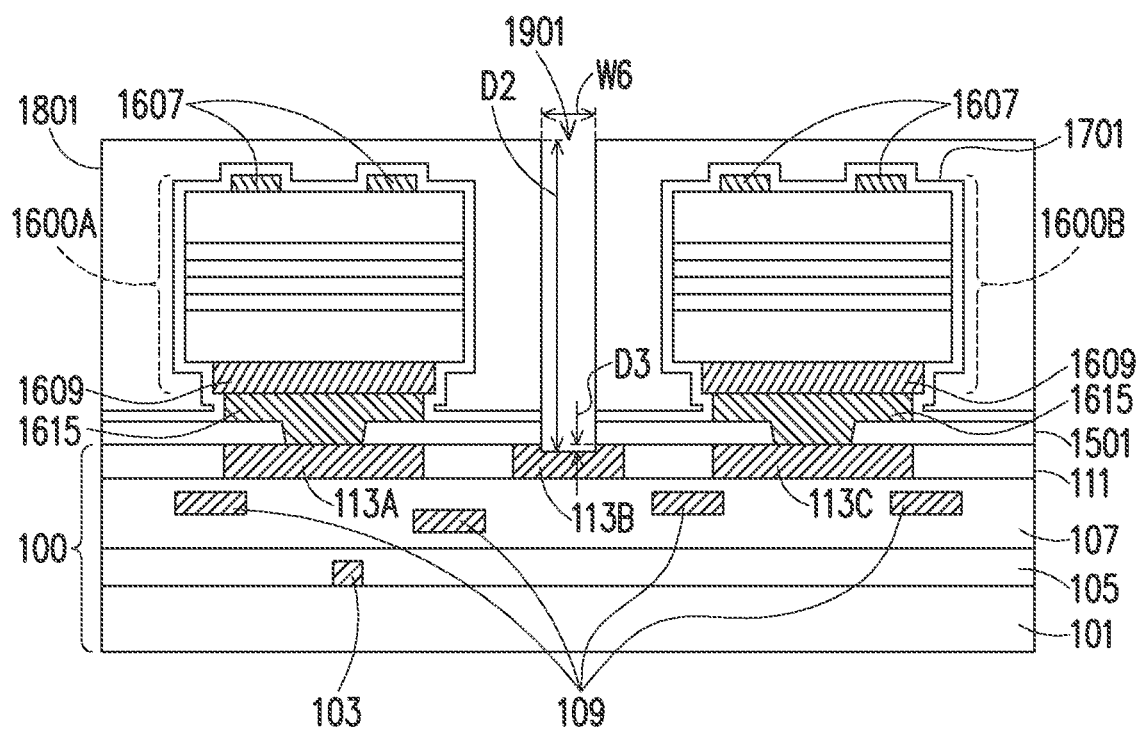

Referring to FIG. 19, an opening 1901 is formed in the gap fill material 1801. The opening 1901 may be formed by depositing a photoresist (not separately illustrated) over the gap fill material 1801, patterning the photoresist, and dry etching the gap fill material 1801. The opening 1901 may extend down to the second metal pad 113B. In some embodiments, as illustrated in FIG. 19, the second metal pad 113B may be etched such that a recess is formed in the topmost surface of the second metal pad 113B. The recess may have a depth D3 of between about 0.5 nm and about 50 nm, such as about 5 nm. The opening 1901 may have a width W6 of between about 0.5 µm and about 10 µm, such as about 1 µm. The opening 1901 may have a depth D2 of between about 3 µm and about 25 µm, such as about 14 µm. As such, the opening 1901 may have an aspect ratio of between about 1 and about 12, such as about 5. The photoresist may be removed by stripping, ashing, or the like.

Figure 20:
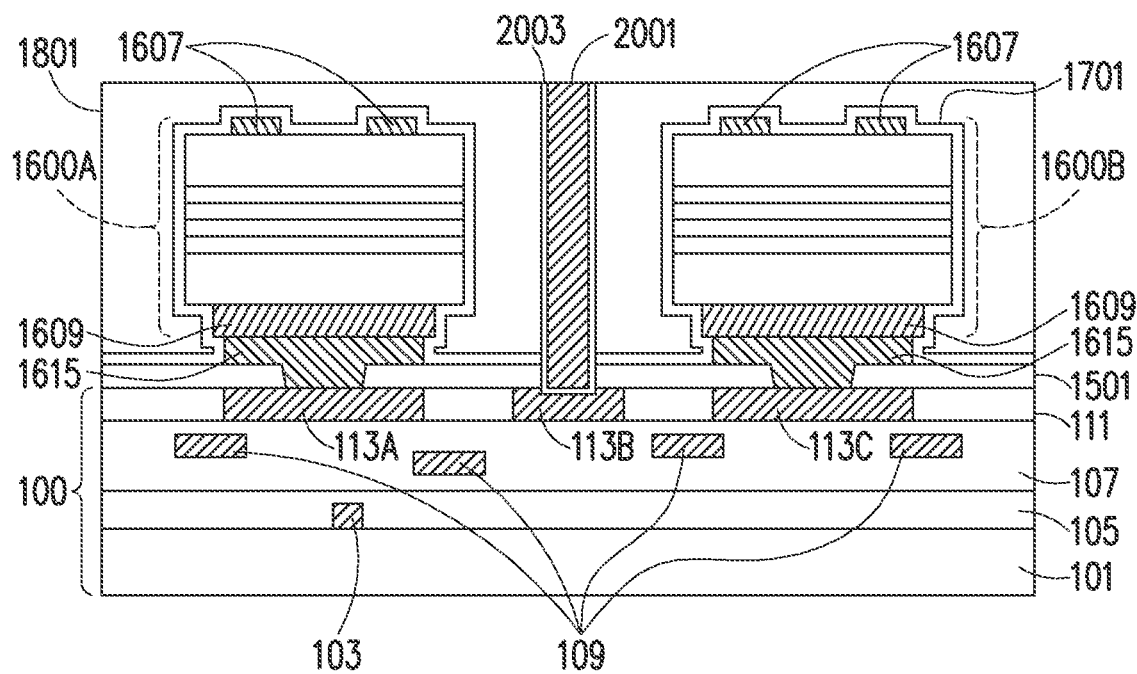

Referring to FIG. 20, a barrier layer is deposited over the gap fill material 1801 and the second metal pad 113B and a conductive fill material is deposited over the barrier layer. The barrier layer may be formed of titanium (Ti), titanium nitride (TiN), tantalum nitride (TaN), combinations thereof, or the like. The barrier layer may be a single layer or multiple layers. The conductive fill material may be formed of copper (Cu), tungsten (W), aluminum (Al), combinations thereof, or the like. The barrier layer may be deposited by sputtering. The conductive fill material may be plated onto the surface of the barrier layer. The barrier layer may be a metal diffusion barrier and may prevent the diffusion of metals from the conductive fill material into the gap fill material 1801.

After the barrier layer and the conductive fill material are deposited, the conductive fill material, the barrier layer, and the gap fill material 1801 are planarized to form a conductive via 2001 having a barrier 2003. The conductive fill material, the barrier layer, and the gap fill material 1801 may be planarized by a CMP process or the like. Following the planarization, top surfaces of the conductive via 2001, the barrier 2003, and the gap fill material 1801 may be coplanar. The conductive via 2001 may be used to connect the top terminals 1607 to the second metal pad 113B. As such, the conductive via 2001 may be electrically connected to the second metal pad 113B.

Figure 21:
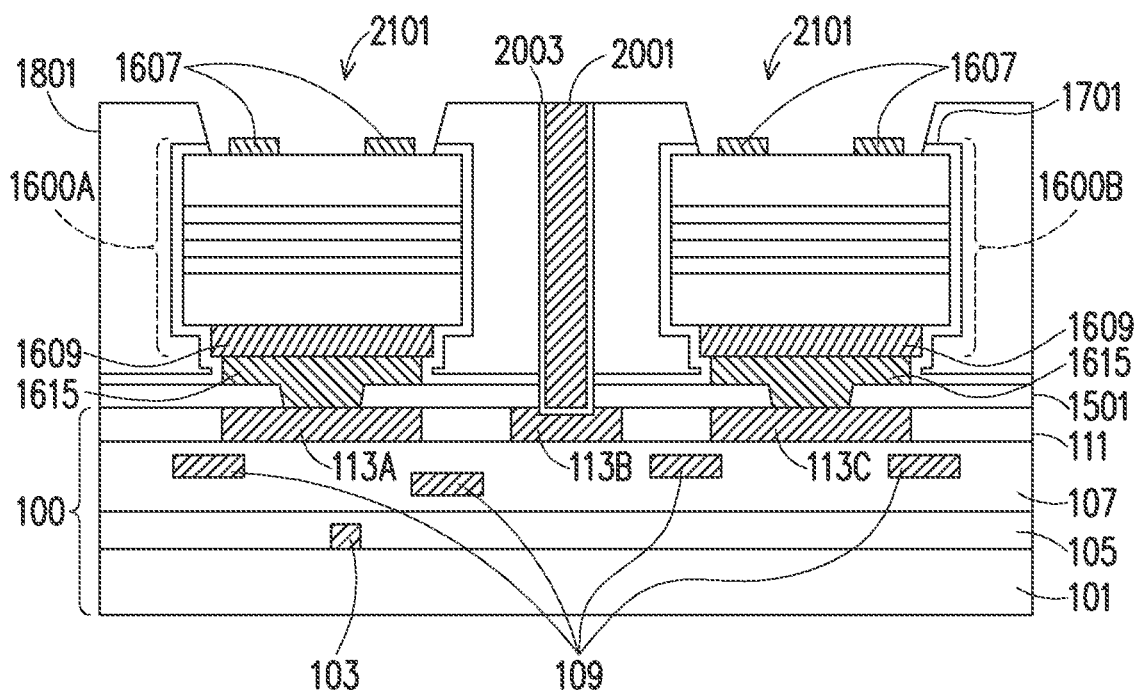

Referring to FIG. 21, first openings 2101 are formed in the gap fill material 1801 and the protection layer 1701. The first openings 2101 expose the n-type doped semiconductor layers 1601 and the top terminals 1607 of the first component device 1600A and the second component device 1600B and may be provided in order to connect the top terminals 1607 to the second metal pad 113B through the conductive via 2001. The first openings 2101 may be formed by depositing a photoresist (not separately illustrated) over the gap fill material 1801, the conductive via 2001, and the barrier 2003. The photoresist is patterned and dry etch processes are used to remove portions of the gap fill material 1801 and the protection layer 1701. The gap fill material 1801 and the protection layer 1701 may be etched by one dry etch process or multiple dry etch processes. The first openings may extend to top surfaces of the component devices 1600. As such, portions of the top surfaces of component devices 1600, side surfaces of the top terminals 1607, and top surfaces of the top terminals 1607 may be exposed. The photoresist is removed by stripping, ashing, or the like.

Figure 22:
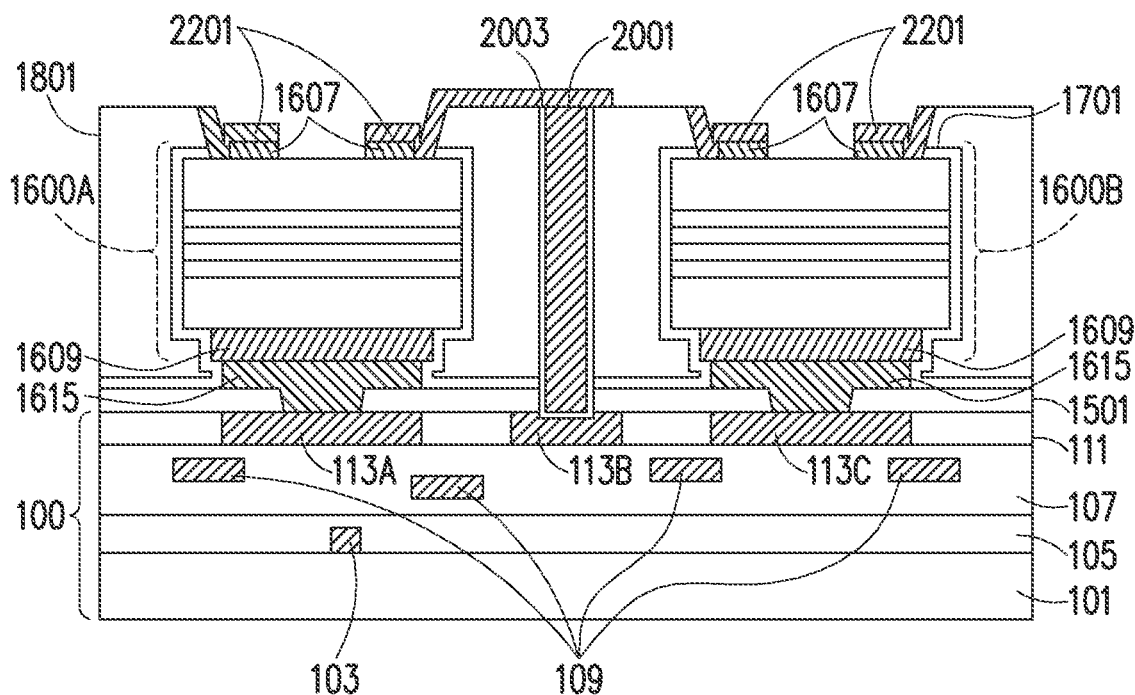

Referring to FIG. 22, redistribution lines 2201 are formed over the first component device 1600A and the second component device 1600B. The redistribution lines 2201 may be formed of copper (Cu), titanium (Ti), platinum (Pt), silver (Ag), aluminum (Al), gold (Au), alloys thereof, or the like. The redistribution lines 2201 may be formed by depositing a seed layer (not separately illustrated) over the gap fill material 1801, the protection layer 1701, and the component devices 1600. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist (not separately illustrated) is then formed and patterned on the seed layer. The photoresist may be formed by spin-coating or the like and may be exposed to light for patterning. The pattern of the photoresist corresponds to the redistribution lines 2201. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise copper. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the redistribution lines 2201. In some embodiments, the redistribution lines 2201 may be formed by evaporation deposition.

As illustrated in FIG. 22, the redistribution lines 2201 may be formed over portions of the component devices 1600 such that at least a portion of the component devices are exposed. The exposed portions of the component devices 1600 may have a circular shape, a square shape, a rectangular shape, an oval shape, another polygonal shape, or any other suitable shape in a top-down view. In embodiments in which the component devices 1600 include LEDs, laser diodes, or photodiodes, the exposed portions of the component devices 1600 may allow for light to pass to or from the diodes of the component devices. In other embodiments, the redistribution lines 2201 may be deposited across the entire exposed top surfaces of the component devices 1600.

The redistribution lines 2201 may connect one or more of the component devices 1600 to the second metal pad 113B through the conductive via 2001. For example, as illustrated in FIG. 22, the redistribution line 2201 is physically and electrically connected to the top terminals 1607 of the first component device 1600A and the conductive via 2001. The conductive via 2001 is physically and electrically connected to the second metal pad 113B. The second component device 1600B may be connected to additional conductive vias (not separately illustrated) by the redistribution lines 2201.

Figure 23:
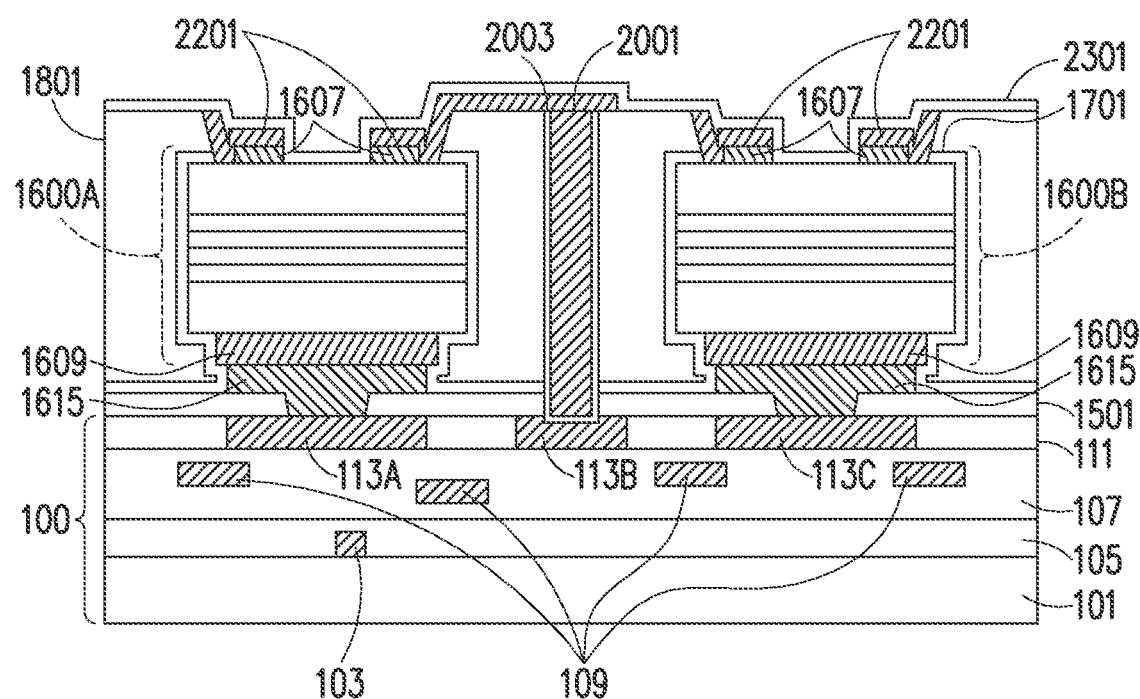

Referring to FIG. 23, a second passivation layer 2301 may be deposited over the gap fill material 1801, the redistribution lines 2201, and the component devices 1600. The second passivation layer 2301 may be formed of silicon nitride (SiN), silicon oxide ($SiO_x$), combinations or multiple layers thereof, or the like. The second passivation layer 2301 may be formed of a material that is optically transparent to certain wavelengths of light. For example, in embodiments in which the component devices 1600 include LEDs, laser diodes, or photo diodes, the second passivation layer 2301 may be formed of a material that is optically transparent to light of a wavelength produced or received by the diodes.

According to various embodiments, the bottom terminals 1609 of the component devices 1600 may be connected to the first wafer 100 through the external connectors 1615, by metal-to-metal bonding, or by hybrid bonding. The top terminals 1607 of the component devices 1600 may be connected to the first wafer 100 through the redistribution lines 2201 and the conductive via 2001. This may allow for component devices having small widths to be connected to a wafer. For example, component devices having widths of less than 50 μm, such as 10 μm to 50 μm, may be connected to the wafer. Moreover, the methods and devices of the present disclosure provide better integration for use in silicon. Additionally, individual component devices may be bonded to a wafer and processed simultaneously. Furthermore, the vias may be formed extending to the same metal layer on which the component devices are to bonded, reducing manufacturing costs.

In accordance with an embodiment, a method includes bonding a first terminal and a second terminal of a first substrate to a third terminal and a fourth terminal of a second substrate; separating the first substrate to form a first component device and a second component device; forming a gap fill material over the first component device, the second component device, and the second substrate; forming a conductive via extending from a top surface of the gap fill material to a fifth terminal of the second substrate; and forming a top terminal over a top surface of the first component device, the top terminal connecting the first component device to the fifth terminal of the second substrate through the conductive via. In an embodiment, separating the first substrate includes depositing a first hard mask over a top surface of the first substrate; patterning the first hard mask to form a first portion and a second portion; and etching the first substrate to form the first component device and the second component device using the first portion and the second portion as a mask. In an embodiment, forming the gap fill material includes depositing the gap fill material over the first component device, the second component device, and the second substrate; and planarizing the gap fill material such that a top surface of the gap fill material is disposed above a top surface of the first component device and a top surface of the second component device. In an embodiment, the first substrate includes a carrier substrate and one or more device layers, and the method further includes after bonding, removing the carrier substrate from the one or more device layers. In an embodiment, the method further includes depositing a protection layer over the first component device, the second component device, and the semiconductor substrate, the gap fill material being formed over the protection layer. In an embodiment, the protection layer is formed by atomic layer deposition (ALD) or chemical vapor deposition (CVD). In an embodiment, forming the conductive via includes etching the gap fill material to form an opening extending to the fifth terminal of the second substrate; depositing a barrier layer over the gap fill material and the second substrate; depositing a conductive fill material over the barrier layer; and planarizing the barrier layer, the conductive fill material, and the gap fill material. In an embodiment, the method further includes forming a first hard mask over the second substrate, the first hard mask being disposed between the first substrate and the second substrate, and forming the conductive via further includes etching the first hard mask to form the opening extending to the fifth terminal of the second substrate.

In another embodiment, a method includes bonding a bottom terminal of a component device to a first metal pad on a first substrate; depositing a protection layer over the first substrate and the component device; depositing a gap fill material over the protection layer; forming a first opening through the gap fill material and the protection layer, the first opening exposing a second metal pad on the first substrate; forming a conductive via in the first opening, the conductive via being connected to the second metal pad; forming a second opening through the protection layer and the gap fill material, the second opening exposing a portion of a top surface of the component device; and forming a top terminal over the top surface of the component device, the top terminal connecting the component device to the conductive via. In an embodiment, bonding the bottom terminal to the first metal pad includes solder bonding the bottom terminal to the first metal pad. In an embodiment, bonding the bottom terminal to the first metal pad includes direct metal-to-metal bonding the bottom terminal to the first metal pad. In an embodiment, the method further includes forming a passivation layer over the top terminal, the passivation layer contacting the gap fill material, the top terminal, and the top surface of the component device. In an embodiment, forming the conductive via includes depositing a barrier layer over the gap fill material and the second metal pad; depositing a conductive fill material over the barrier layer; and planarizing the barrier layer and the conductive fill material. In an embodiment, the method further includes forming a first hard mask over the semiconductor substrate, and bonding the bottom terminal to the first metal pad includes patterning the first hard mask to form a third opening, the third opening exposing the first metal pad; forming a solder bump over the first metal pad; and reflowing the solder bump to form a solder joint, wherein the bottom terminal is bonded to the first metal pad through the solder joint. In an embodiment, depositing the protection layer includes conformally depositing the protection layer by atomic layer deposition (ALD) or chemical vapor deposition (CVD).

In accordance with yet another an embodiment, a device includes a first metal pad and a second metal pad on a substrate; a component device over the first metal pad, the component device including a bottom terminal and a top terminal disposed on opposite sides of the component device, the bottom terminal electrically coupling the component device to the first metal pad; a gap fill material surrounding the component device; a conductive via over the second metal pad, the conductive via extending through the gap fill material to the second metal pad, wherein a top surface of the gap fill material is level with a top surface of the conductive via; and an interconnect electrically coupling the top terminal of the component device to the conductive via. In an embodiment, the component device is a diode, and at least a portion of a top surface of the component device is exposed through the top terminal. In an embodiment, the component device has a width of between about 10 μm and about 50 µm. In an embodiment, a bottom surface of the conductive via is disposed below a bottom surface of the bottom terminal. In an embodiment, the bottom terminal is bonded to the first metal pad by a metal-to-metal bond.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first metal pad and a second metal pad on a substrate;
    a component device over the first metal pad, the component device comprising a bottom terminal, a top terminal, and one or more semiconductor layers, the bottom terminal and the top terminal being disposed on opposite sides of the one or more semiconductor layers, the bottom terminal electrically coupling the one or more semiconductor layers to the first metal pad, wherein the bottom terminal and the top terminal are in contact with the one or more semiconductor layers;
    a gap fill material surrounding the component device;
    a conductive via over the second metal pad, the conductive via extending through the gap fill material to the second metal pad, wherein a top surface of the gap fill material is level with a top surface of the conductive via; and
    an interconnect electrically coupling the top terminal of the component device to the conductive via.

2. The device of claim 1, wherein the component device is a diode, and wherein at least a portion of a top surface of the one or more semiconductor layers is exposed through the top terminal.

3. The device of claim 1, wherein the component device has a width of between about 10 µm and about 50 µm.

4. The device of claim 1, wherein a bottom surface of the conductive via is disposed below a bottom surface of the bottom terminal.

5. The device of claim 1, wherein the bottom terminal is bonded to the first metal pad by a metal-to-metal bond.

6. The device of claim 1, wherein a top surface of the conductive via is disposed above a top surface of the top terminal.

7. The device of claim 1, wherein the one or more semiconductor layers comprise alternating layers of a p-type doped semiconductor material and an n-type doped semiconductor material.

8. The device of claim 1, wherein the one or more semiconductor layers comprise a layer of indium gallium nitride (InGaN) and a layer of gallium nitride (GaN).

9. A semiconductor device comprising:
    a first metal pad and a second metal pad over a first substrate;
    a component device over the first substrate, the component device comprising a bottom terminal bonded to the first metal pad, the component device further comprising a top terminal;
    a protective layer in contact with sidewalls of the bottom terminal and the top terminal;
    a gap fill material over and surrounding the protective layer;
    a conductive via extending through the gap fill material and the protective layer, the conductive via being connected to the second metal pad; and
    a redistribution line extending through the gap fill material and the protective layer, the redistribution line connecting the top terminal to the conductive via.

10. The semiconductor device of claim 9, further comprising a passivation layer extending along surfaces of the gap fill material, the redistribution line, and the component device.

11. The semiconductor device of claim 9, wherein the component device comprises an n-type doped semiconductor layer, a p-type doped semiconductor layer, and a multiple quantum well.

12. The semiconductor device of claim 11, wherein the multiple quantum well comprises alternating layers of indium gallium nitride (InGaN) and gallium nitride (GaN).

13. The semiconductor device of claim 9, wherein the bottom terminal is solder bonded to the first metal pad.

14. The semiconductor device of claim 9, wherein the top terminal is ring-shaped in a top-down view.

15. A semiconductor device comprising:
    a first substrate comprising a first terminal and a second terminal;
    a first component device comprising a third terminal bonded to the first terminal;
    a gap fill material over the first substrate and the first component device, the gap fill material surrounding the first component device;
    a conductive via extending from a top surface of the gap fill material to the second terminal; and
    a fourth terminal over a top surface of the first component device, the fourth terminal connecting the first component device to the second terminal through the conductive via, wherein the fourth terminal is in contact with a first semiconductor material of the first component device.

16. The semiconductor device of claim 15, wherein the fourth terminal extends at least partially through the gap fill material.

17. The semiconductor device of claim 15, further comprising a redistribution line connecting the fourth terminal to the conductive via.

18. The semiconductor device of claim 15, wherein the fourth terminal comprises a ring-shape in a top-down view.

19. The semiconductor device of claim 18, further comprising an optically transparent passivation layer over the gap fill material and the fourth terminal.

20. The semiconductor device of claim 15, wherein a height of the conductive via is greater than a combined height of the first component device and the fourth terminal.

* * * * *